US00RE39771E

(19) United States
(12) Reissued Patent
Kobayashi et al.

(10) Patent Number: US RE39,771 E
(45) Date of Reissued Patent: Aug. 14, 2007

(54) CODE CONVERSION METHOD AND APPARATUS, CODE RECORDING MEDIUM, CODE RECORDING APPARATUS AND CODE REPRODUCING APPARATUS

(75) Inventors: Yoshiharu Kobayashi, Katano (JP); Akira Mutoh, Sakai (JP); Shin-ichi Tanaka, Kyoto (JP); Nobuo Akahira, Yawata (JP)

(73) Assignee: Matsushita Electric Industrial Co., Ltd., Kadoma (JP)

(21) Appl. No.: 09/844,740

(22) Filed: Apr. 26, 2001

Related U.S. Patent Documents

Reissue of:
(64) Patent No.: 5,898,394
Issued: Apr. 27, 1999
Appl. No.: 08/900,436
Filed: Jul. 25, 1997

(30) Foreign Application Priority Data

Jul. 31, 1996 (JP) ..... 8-201615
Sep. 11, 1996 (JP) ..... 8-240304

(51) Int. Cl.
*H03M 7/00* (2006.01)

(52) U.S. Cl. ..... 341/58; 341/59; 360/39
(58) Field of Classification Search ..... 341/58, 341/59, 50, 94, 95; 360/39, 48, 95, 44.38, 360/32
See application file for complete search history.

(56) References Cited

U.S. PATENT DOCUMENTS 4,603,413 A * 7/1986 Sinjou et al. ..... 369/59.24
4,731,797 A * 3/1988 Jaffre et al. ..... 375/292
4,771,463 A * 9/1988 Beeman ..... 380/46
5,122,912 A * 6/1992 Kanota et al. ..... 360/46
5,151,699 A * 9/1992 Moriyama ..... 341/58
5,245,661 A * 9/1993 Lee et al. ..... 380/268
5,432,853 A * 7/1995 Yamamoto ..... 331/38
5,451,943 A * 9/1995 Satomura ..... 341/58
5,629,983 A * 5/1997 Fujimoto ..... 380/46
5,655,078 A * 8/1997 Anderson et al. ..... 375/295
5,661,707 A * 8/1997 Matsui ..... 369/59.24
5,671,226 A * 9/1997 Murakami et al. ..... 370/474
5,790,487 A 8/1998 Moriya et al. ..... 369/48
5,815,514 A * 9/1998 Gray ..... 341/42
5,850,379 A 12/1998 Moriya et al. ..... 369/59
5,930,251 A * 7/1999 Murakami et al. ..... 370/395.65
6,052,390 A * 4/2000 Deliot et al. ..... 370/528
6,177,890 B1 * 1/2001 Keirn et al. ..... 341/59
6,253,349 B1 * 6/2001 Maeda et al. ..... 714/799
6,408,073 B1 * 6/2002 Hsu et al. ..... 380/241

FOREIGN PATENT DOCUMENTS

EP 0 343 930 5/1989
JP 939552 * 1/1999

OTHER PUBLICATIONS

Kees A. Schohamer Immink: EFMPlus: "The Coding Format of the Multimedia Compact Disc" Aug. 1, 1995; IEEE Transactions on Consumer Electronics, vol. 41, No. 3, pp. 491–497.

ECMA: "Data interchange on read–only 120 mm optical data disks (CD–ROM)" Standard ECMA–130, pp. 31, 43 Jun. 1996.

European Search Report regarding Application No. 97113214.7–1247 dated Feb. 2, 2002.

* cited by examiner

*Primary Examiner*—Peguy JeanPierre
(74) *Attorney, Agent, or Firm*—Renner, Otto, Boisselle & Sklar, LLP

(57) ABSTRACT

A code conversion method and apparatus is provided for scrambling and modulating data. The method and apparatus includes scrambling an input main data unit based on any of plural types of pseudo-random number sequences, and modulating the scrambled main data unit based on any of plural types of modulation data. An output main data unit is produced from the modulated main data unit, and a calculated value representing a difference between a number of 0 bits and a number of 1 bits included in the output main data unit is obtained. Any of the modulation data is then selected dependent upon the calculated value. The method and apparatus further includes determining whether or not a variation of the calculated value has exceeded a predetermined threshold, newly selecting another pseudo-random number sequence used for the step of scrambling if it is determined that the variation of the calculated value has exceeded the predetermined threshold value, and re-scrambling the input main data unit based on the newly selected pseudo-random number sequence.

43 Claims, 24 Drawing Sheets

*FIG. 14*

| Bit string | Initial value |
|---|---|
| 0h | 0001h |
| 1 | 5500 |
| 2 | 0002 |
| 3 | 2A00 |
| 4 | 0004 |
| 5 | 5400 |
| 6 | 0008 |
| 7 | 2800 |
| 8 | 0010 |
| 9 | 5000 |
| A | 0020 |
| B | 2001 |
| C | 0040 |
| D | 4002 |
| E | 0080 |
| F | 0005 |

*FIG. 15*

| Bit string \ Initial value | Rewrite repetition times 0 | Rewrite repetition times 1 | Rewrite repetition times 2 | ------ | Rewrite repetition times 15 |
|---|---|---|---|---|---|
| 0h | 0001h | 0090h | 0003h | ------ | 0031h |
| 1 | 5500 | 3C00 | 2400 | ------ | 2000 |
| 2 | 0002 | 00A0 | 0005 | ------ | 0032 |
| 3 | 2A00 | 1E00 | 1200 | ------ | 1600 |
| 4 | 0004 | 00C0 | 0006 | ------ | 0034 |
| 5 | 5400 | 3B00 | 2300 | ------ | 2B00 |
| 6 | 0008 | 00F0 | 0007 | ------ | 0038 |
| 7 | 2800 | 1D00 | 1100 | ------ | 1300 |
| 8 | 0010 | 0009 | 0030 | ------ | 0013 |
| 9 | 5000 | 3A00 | 2500 | ------ | 2A00 |
| A | 0020 | 000A | 0050 | ------ | 0023 |
| B | 2001 | 1003 | 3001 | ------ | 2007 |
| C | 0040 | 0000 | 0060 | ------ | 0043 |
| D | 4002 | 2006 | 6002 | ------ | 400E |
| E | 0080 | 000F | 0070 | ------ | 0083 |
| F | 0005 | 00A3 | 0052 | ------ | 00A2 |

CODE CONVERSION METHOD AND APPARATUS, CODE RECORDING MEDIUM, CODE RECORDING APPARATUS AND CODE REPRODUCING APPARATUS

Matter enclosed in heavy brackets [ ] appears in the original patent but forms no part of this reissue specification; matter printed in italics indicates the additions made by reissue.

*This application is a continuation of application is a reissue of 08/900,436 filed on Jul. 25, 1997, now U.S. Pat. No. 5,898,394.*

BACKGROUND OF THE INVENTION

1. Field of the Invention

The present invention relates to a code conversion method and apparatus for scrambling and modulating data, a code recording medium on which the scrambled and modulated data may be recorded and code recording and reproducing apparatus for recording/reproducing the scrambled and modulated data onto/from a recording medium.

2. Description of the Related Art

Optical disks have become very popular as recording media for recording various types of software data such as video data, audio data and computer data thereon. The optical disks include various kinds of read-only type disks such as a laser disk (LD), a compact disk (CD), a compact disk read-only memory (CD-ROM) and various kinds of rewritable and/or write-once type disks such as a magneto-optic disk, a phase change disk and a recordable compact disk (CD-R).

On the other hand, in recent years, high-efficiency coding technologies also have been developed. Consequently, any type of data currently can be processed as digital data. For example, even video data can be band compressed so as to be processed as digital data. In view of these developments, increasingly it has become necessary to further increase the capacity and the recording density of an optical disk.

However, as the recording density of a recording medium is increased, the difference between the signals representing a value of "1" and the signals representing a value of "0" which have been read out from such a recording medium becomes smaller. As a result, a read margin is adversely decreased and the quality of a reproduced signal is more likely to be degraded.

In order to avoid such a degradation in quality of a reproduced signal, the low frequency components of a signal must be reduced when the signal is recorded onto a recording medium. This is because a signal reproduced from an optical disk contains a lot of low frequency noise, which must be removed by a filter in order to improve the signal to noise (S/N) ratio of a reproduced signal. Thus, since the filter also cuts the necessary low frequency components of the reproduced signal, the effects of the noise reduction may be alleviated by preliminarily reducing the low frequency components of the signal to be recorded.

Various data coding methods have been proposed for reducing the low frequency components thereof. However, even when any of these coding methods is applied, a data pattern having low frequency components which cannot be reduced may still appear for a long duration in some cases. Thus, it is effective to scramble data for reducing the possibility.

When data is recorded and/or reproduced onto/from a recording medium, recording and reproducing operations are performed on the basis of a data unit having a particular size. Such a data unit is called a "sector". The run length of the codes recorded on a sector is limited in order to narrow the frequency bandwidth of a channel for the recording/reproducing apparatus.

Once an error is generated when the data is recorded and/or reproduced onto/from the run-length limited sector, the error does not remain in the erroneous sector but is propagated into succeeding sectors of the data. In order to prevent such error propagation, predetermined patterns identifiable from the recorded data are recorded onto every sector at regular intervals. Such patterns are called "sync codes". The respective regions of a sector which are partitioned by these sync codes are called "frames".

As mentioned above, since the low frequency components of data must be reduced when the data is recorded, the data is converted before the data is recorded. The conversion is accomplished, for example, by a code conversion apparatus such as that shown in FIG. 18.

As shown in FIG. 18, when main data is input to a scrambler 101, the scrambler 101 scrambles the main data in accordance with a pseudo-random number sequence and then supplies the scrambled main data to an 8/16 modulator 102. When the scrambled main data is input to the 8/16 modulator 102, the 8/16 modulator 102 modulates the main data and then outputs the modulated main data as recording data. The recording data is transmitted to a recording/reproducing apparatus to be recorded onto a recording medium.

In addition, the higher 4 bits (i.e., bit 4 to bit 8) of the logical address (8 bits) associated with the input main data is also input to the scrambler 101 as a seed select signal. Scramble data of different types are sequentially selected within a set of 16 logical addresses (i.e., on the basis of 16 sectors). That is to say, single scramble data is represented by any of respectively different 16 types of pseudo-random number sequences. Thus, in the respective sectors, the 16 types of pseudo-random number sequences associated with the respective scramble data are sequentially selected. Moreover, the scrambler 101 scrambles for data included in one sector depending upon the selected pseudo-random number sequences, in response to a sector start signal.

The scrambling is performed by the scrambler 101 by obtaining the exclusive-OR of the main data and the data (or random numbers) generated from an M sequence (maximum length sequence) represented by the following generating polynomial (1) for every bit of both types of data.

$$X^{15}+X^{4}+1 \tag{1}$$

FIG. 19 illustrates a configuration of the scrambler 101. As shown in FIG. 19, the initial bit patterns of the 16 types of pseudo-random number sequences are stored beforehand in a seed ROM 111. In response to a seed select signal, any of these initial bit patterns is selected from the seed ROM 111. A shift register 112 receives the initial bit pattern selected from the seed ROM 111 in response to a seed load signal and then sequentially shifts the initial bit pattern in synchronization with a bit clock. An exclusive-OR element 113 obtains an exclusive-OR of the bit shifted out by the shift register 112 and the fourth most significant bit stored in the shift register 112 and then returns the operation result to the shift register 112. The lower 8 bits stored in the shift register 112 are latched in a flip-flop 114 in synchronization with a word clock. A corresponding bit of the 8-bit string latched in the flip-flop 114 is applied to an individual exclusive-OR element 115. Not only the corresponding bit of the 8-bit string but also a corresponding bit of 8-bit main data word are input to each of these exclusive-OR elements 115, which obtains the exclusive-OR of each pair of bits and then outputs the operation result.

On the other hand, the 8/16 modulator 102 performs a two-stage modulation to produce an output main data from the scrambled main data. The first stage modulation is performed to produce 16-bit main data from 8-bit main data by modulating the scrambled data by means of a pit position modulation (PPM), while the second stage modulation is performed to produce 16-bit output main data from the 16-bit main data by modulating the 16-bit main data by means of a pulse width modulation (PWM).

FIG. 20 illustrates a configuration of the 8/16 modulator 102. As shown in FIG. 20, the 8-bit main data scrambled by the scrambler 101 is not only supplied to a main table 122 and a sub-table 123 via a flip-flop 121 but also directly supplied to a digital sum value (DSV) controller 124. The main data and data representing the next state as selected by a selector 125 are input to the main table 122. Similarly, the main data and the data representing the next state as selected by the selector 125 are input to the sub-table 123.

The main table 122 includes the main data shown in the following Table 1. An 8-bit main data value is searched for by state in the main table 122 and a 16-bit main data word corresponding to the next state is selected and output with reference to the main data shown in Table 1. Similarly, the sub-table 123 includes the sub-data shown in the following Table 2. An 8-bit main data value is searched for by state in the sub-table 123 and a 16-bit main data word corresponding to the next state is selected and output with reference to the sub-data shown in Table 2.

Since the range of the 8-bit main data values is from 0 to 255, 256 sets of 16-bit main data words are defined beforehand in the main table 122 for the respective 8-bit main data values (0 to 255). However, it should be noted that only a part (0 to 45) of the 8-bit main data values (0 to 255) and only a part of the 16-bit main data words corresponding to these 46 values are shown in Table 1. On the other hand, in the sub-table 123, 88 sets of 16-bit main data words are defined for a part (0 to 87) of the 8-bit main data values (0 to 255), unlike the main table 122. However, a smaller part (0 to 45) of the 88 8-bit main data values (0 to 87) and a smaller part of the 16-bit main data words corresponding to the 46 values are shown in Table 2. Furthermore, in both the tables 122 and 123, the next state is defined for each of the 16-bit main data words. Thus, when the 16-bit main data word is searched for, the next state corresponding to the 16-bit main data word is also read out.

TABLE 1

Conversion table for 8/16 modulated codes(main)

| Main | State 1 | | | State 2 | | | State 3 | | | State 4 | | |
|---|---|---|---|---|---|---|---|---|---|---|---|---|
| data | Code Word | | Next | Code Word | | Next | Code Word | | Next | Code Word | | Next |
| value | MSB | LSB | State | MSB | LSB | State | MSB | LSB | State | MSB | LSB | State |
| 0 | 0010000000001001 | | 1 | 0100000100100000 | | 2 | 0010000000001001 | | 1 | 0100000100100000 | | 2 |
| 1 | 0010000000010010 | | 1 | 0010000000010010 | | 1 | 1000000100100000 | | 3 | 1000000100100000 | | 3 |
| 2 | 0010000100100000 | | 2 | 0010000100100000 | | 2 | 1000000000010010 | | 1 | 1000000000010010 | | 1 |
| 3 | 0010000001001000 | | 2 | 0100010010000000 | | 4 | 0010000001001000 | | 2 | 0100010010000000 | | 4 |
| 4 | 0010000010010000 | | 2 | 0010000010010000 | | 2 | 1000000100100000 | | 2 | 1000000100100000 | | 2 |
| 5 | 0010000000100100 | | 2 | 0010000000100100 | | 2 | 1001001000000000 | | 4 | 1001001000000000 | | 4 |
| 6 | 0010000000100100 | | 3 | 0010000000100100 | | 3 | 1000100100000000 | | 4 | 1000100100000000 | | 4 |
| 7 | 0010000001001000 | | 3 | 0100000000010010 | | 1 | 0010000001001000 | | 3 | 0100000000010010 | | 1 |
| 8 | 0010000010010000 | | 3 | 0010000010010000 | | 3 | 1000010010000000 | | 4 | 1000010010000000 | | 4 |
| 9 | 0010000100100000 | | 3 | 0010000100100000 | | 3 | 1001001000000001 | | 1 | 1001001000000001 | | 1 |
| 10 | 0010010010000000 | | 4 | 0010010010000000 | | 4 | 1000100100000001 | | 1 | 1001001000000001 | | 1 |
| 11 | 0010001001000000 | | 4 | 0010001001000000 | | 4 | 1000000010010000 | | 3 | 1000000010010000 | | 3 |
| 12 | 0010010010000001 | | 1 | 0010010010000001 | | 1 | 1000000010010000 | | 2 | 1000000010010000 | | 2 |
| 13 | 0010001001000001 | | 1 | 0010001001000001 | | 1 | 1000010010000001 | | 1 | 1000010010000001 | | 1 |
| 14 | 0010000001001001 | | 1 | 0100000000100100 | | 3 | 0010000001001001 | | 1 | 0100000000100100 | | 3 |
| 15 | 0010000100100001 | | 1 | 0010001001000001 | | 1 | 1000001001000001 | | 1 | 1000010001000001 | | 1 |
| 16 | 0010000010010001 | | 1 | 0010000100100001 | | 1 | 1000000100100001 | | 1 | 1000000100100001 | | 1 |
| 17 | 0010000000100010 | | 1 | 0010000000100010 | | 1 | 1000001001000000 | | 4 | 1000001001000000 | | 4 |
| 18 | 0001000000001001 | | 1 | 0100000010010000 | | 2 | 0001000000001001 | | 1 | 0100000010010000 | | 2 |
| 19 | 0010000000010001 | | 1 | 0010000000010001 | | 1 | 1001000100000000 | | 4 | 1001000100000000 | | 4 |
| 20 | 0001000000010010 | | 1 | 0001000000010010 | | 1 | 1000100010000000 | | 4 | 1000100010000000 | | 4 |
| 21 | 0000100000000010 | | 1 | 0000100000000010 | | 1 | 1000000010010001 | | 1 | 1000000010010001 | | 1 |
| 22 | 0000010000000001 | | 1 | 0000010000000001 | | 1 | 1000000001001001 | | 1 | 1000000001001001 | | 1 |
| 23 | 0010001000100000 | | 2 | 0010001000100000 | | 2 | 1000000001001000 | | 2 | 1000000001001000 | | 2 |
| 24 | 0010000100010000 | | 2 | 0010000100010000 | | 2 | 1000000001001000 | | 3 | 1000000001001000 | | 3 |
| 25 | 0010000010001000 | | 2 | 0100000000100100 | | 2 | 0010000010001000 | | 2 | 0100000000100100 | | 2 |
| 26 | 0010000001000100 | | 2 | 0010000001000100 | | 2 | 1000000000100010 | | 1 | 1000000000100010 | | 1 |
| 27 | 0001000100100000 | | 2 | 0001000100100000 | | 2 | 1000000000010001 | | 1 | 1000000000010001 | | 1 |
| 28 | 0010000000001000 | | 2 | 0100000010010000 | | 3 | 0010000000001000 | | 2 | 0100000010010000 | | 3 |
| 29 | 0001000010010000 | | 2 | 0001000010010000 | | 2 | 1001001000000010 | | 1 | 1001001000000010 | | 1 |
| 30 | 0001000001001000 | | 2 | 0100000100100000 | | 3 | 0001000001001000 | | 2 | 0100000100100000 | | 3 |
| 31 | 0001000000100100 | | 2 | 0001000000100100 | | 2 | 1001000100000001 | | 1 | 1001000100000001 | | 1 |
| 32 | 0001000000000100 | | 2 | 0001000000000100 | | 2 | 1000100100000010 | | 1 | 1000100100000010 | | 1 |
| 33 | 0001000000000100 | | 3 | 0001000000000100 | | 3 | 1000100010000001 | | 1 | 1000100010000001 | | 1 |
| 34 | 0001000000100100 | | 3 | 0001000000100100 | | 3 | 1000000000100100 | | 2 | 1000000000100100 | | 2 |
| 35 | 0001000001001000 | | 3 | 0100001001000000 | | 4 | 0001000001001000 | | 3 | 0100001001000000 | | 4 |
| 36 | 0001000010010000 | | 3 | 0001000010010000 | | 3 | 1000000000100100 | | 3 | 1000000000100100 | | 3 |
| 37 | 0001000100100000 | | 3 | 0001000100100000 | | 3 | 1000010001000000 | | 4 | 1000010001000000 | | 4 |
| 38 | 0010000000001000 | | 3 | 0100100100000001 | | 1 | 0010000000001000 | | 3 | 0100100100000001 | | 1 |

TABLE 1-continued

Conversion table for 8/16 modulated codes(main)

| Main | State 1 | | | State 2 | | | State 3 | | | State 4 | | |
|---|---|---|---|---|---|---|---|---|---|---|---|---|
| data | Code Word | | Next | Code Word | | Next | Code Word | | Next | Code Word | | Next |
| value | MSB | LSB | State | MSB | LSB | State | MSB | LSB | State | MSB | LSB | State |
| 39 | 0010000001000100 | | 3 | 0010000001000100 | | 3 | 1001000010000000 | | 4 | 1001000010000000 | | 4 |
| 40 | 0010000010001000 | | 3 | 0100010010000001 | | 1 | 0010000010001000 | | 3 | 0100010010000001 | | 1 |
| 41 | 0010000100010000 | | 3 | 0010000100010000 | | 3 | 1000010010000010 | | 1 | 1000010010000010 | | 1 |
| 42 | 0010001000100000 | | 3 | 0010001000100000 | | 3 | 1000001000100000 | | 2 | 1000001000100000 | | 2 |
| 43 | 0010010001000000 | | 4 | 0010010001000000 | | 4 | 1000010001000001 | | 1 | 1000010001000001 | | 1 |
| 44 | 0001001001000000 | | 4 | 0001001001000000 | | 4 | 1000001000100000 | | 3 | 1000001000100000 | | 3 |
| 45 | 00000001000000001 | | 1 | 0100010001000000 | | 4 | 1000001001000010 | | 1 | 0100010001000000 | | 4 |

TABLE 2

Conversion table for 8/16 modulated codes(sub)

| Main | State 1 | | | State 2 | | | State 3 | | | State 4 | | |
|---|---|---|---|---|---|---|---|---|---|---|---|---|
| data | Code Word | | Next | Code Word | | Next | Code Word | | Next | Code Word | | Next |
| value | MSB | LSB | State | MSB | LSB | State | MSB | LSB | State | MSB | LSB | State |
| 0 | 0000010010000000 | | 4 | 0000010010000000 | | 4 | 0100100001001000 | | 2 | 0100100001001000 | | 2 |
| 1 | 0000100100000000 | | 4 | 0000100100000000 | | 4 | 0100100001001000 | | 3 | 0100100001001000 | | 3 |
| 2 | 0001001000000000 | | 4 | 0001001000000000 | | 4 | 0100100000001001 | | 1 | 0100100000001001 | | 1 |
| 3 | 0000001001000000 | | 4 | 0100010000000001 | | 1 | 1000001000000000 | | 4 | 0100010000000001 | | 1 |
| 4 | 0000000100100000 | | 3 | 0100100000000010 | | 1 | 1001000000000100 | | 3 | 0100100000000010 | | 1 |
| 5 | 0000000010010000 | | 3 | 0100001000000000 | | 4 | 1001000000100100 | | 3 | 0100001000000000 | | 4 |
| 6 | 0000000001001000 | | 3 | 0100100000000100 | | 2 | 1001000001001000 | | 3 | 0100100000000100 | | 2 |
| 7 | 0000000001001000 | | 2 | 0100000100000000 | | 4 | 1001000000000100 | | 2 | 0100000100000000 | | 4 |
| 8 | 0000000010010000 | | 2 | 0100100010010000 | | 3 | 1001000000100100 | | 2 | 0100100010010000 | | 3 |
| 9 | 0000000100100000 | | 2 | 0000100000100100 | | 2 | 1001000001001000 | | 2 | 0100100000100100 | | 2 |
| 10 | 000001000100000 | | 4 | 0000010001000000 | | 4 | 1001001001000000 | | 4 | 1001001001000000 | | 4 |
| 11 | 0000100001000000 | | 4 | 0000100010000000 | | 4 | 1000100001001000 | | 3 | 1000100001001000 | | 3 |
| 12 | 0001000100000000 | | 4 | 0001000100000000 | | 4 | 0100010001001000 | | 3 | 0100010001001000 | | 3 |
| 13 | 0010001000000000 | | 4 | 0010001000000000 | | 4 | 1000100000000100 | | 3 | 1000100000000100 | | 3 |
| 14 | 0000001000100000 | | 3 | 0100100000000100 | | 3 | 1001000010010000 | | 3 | 0100100000000100 | | 3 |
| 15 | 0000000100010000 | | 3 | 0100100010010000 | | 2 | 1001000100100000 | | 3 | 0100100010010000 | | 2 |
| 16 | 0000000010001000 | | 3 | 0100001000000001 | | 1 | 0100100000001000 | | 3 | 0100001000001001 | | 1 |
| 17 | 0000000001000100 | | 3 | 0100010000000010 | | 1 | 0100100010001000 | | 3 | 0100010000000010 | | 1 |
| 18 | 0000000001000100 | | 2 | 0100100000100100 | | 3 | 1001000010010000 | | 2 | 0100100000100100 | | 3 |
| 19 | 0010000010001000 | | 2 | 0100100100100000 | | 3 | 1001000100100000 | | 2 | 0100100100010000 | | 3 |
| 20 | 0000000100010000 | | 2 | 0100100100100000 | | 2 | 0100010001001000 | | 2 | 0100100100100000 | | 2 |
| 21 | 0000001000100000 | | 2 | 0100100000010010 | | 1 | 0100100000001000 | | 2 | 0100100000010010 | | 1 |
| 22 | 0000010010000001 | | 1 | 0000010010000001 | | 1 | 1000100000100100 | | 3 | 1000100000100100 | | 3 |
| 23 | 0000100100000001 | | 1 | 0000100100000001 | | 1 | 1000100010010000 | | 3 | 1000100010010000 | | 3 |
| 24 | 0001001000000001 | | 1 | 0001001000000001 | | 1 | 0100100010001000 | | 2 | 0100100010001000 | | 2 |
| 25 | 0010010000000001 | | 1 | 0010010000000001 | | 1 | 1000100000000100 | | 2 | 1000100000000100 | | 2 |
| 26 | 0010000001001001 | | 1 | 0100010000000100 | | 3 | 1000010000000001 | | 1 | 0100100000000100 | | 3 |
| 27 | 0000000010010001 | | 1 | 0100000100000001 | | 1 | 1000100000000010 | | 1 | 0100000100000001 | | 1 |
| 28 | 0000000100100001 | | 1 | 0100010000000100 | | 2 | 1001000000001001 | | 1 | 0100010000000100 | | 2 |
| 29 | 0000001001000001 | | 1 | 0100001000000010 | | 1 | 1001000000010010 | | 1 | 0100001000000010 | | 1 |
| 30 | 0001000001000000 | | 4 | 0000100001000000 | | 4 | 1000100000100100 | | 2 | 1000100000100100 | | 2 |
| 31 | 0001000010000000 | | 4 | 0001000010000000 | | 4 | 1000100001001000 | | 2 | 1000100001001000 | | 2 |
| 32 | 0001000100000000 | | 4 | 0010000100000000 | | 4 | 0100010000001001 | | 1 | 0100100000001001 | | 1 |
| 33 | 0000010000100000 | | 3 | 0000010000100000 | | 3 | 0100100001001001 | | 1 | 0100100001001001 | | 1 |
| 34 | 0000001000010000 | | 3 | 0100010000010010 | | 1 | 1000100100100000 | | 3 | 0100010000010010 | | 1 |
| 35 | 0000000100001000 | | 3 | 0100100000010001 | | 1 | 1001000000001000 | | 3 | 0100100000010001 | | 1 |
| 36 | 0000000010000100 | | 3 | 0100000100000000 | | 4 | 1001000001000100 | | 3 | 0100000100000000 | | 4 |
| 37 | 0000010000100000 | | 2 | 0000010000100000 | | 2 | 1000001000000001 | | 1 | 1000001000000001 | | 1 |
| 38 | 0000000010000100 | | 2 | 0100010000100100 | | 3 | 1000100010010000 | | 2 | 0100010000100100 | | 3 |
| 39 | 0000000100001000 | | 2 | 0100010000100100 | | 2 | 1000100100100000 | | 2 | 0100010000100100 | | 2 |
| 40 | 0000001000010000 | | 2 | 0100100000100010 | | 1 | 1001000000001000 | | 2 | 0100100000100010 | | 1 |
| 41 | 0000010001000001 | | 1 | 0000010001000001 | | 1 | 1000010000000010 | | 1 | 1000010000000010 | | 1 |
| 42 | 0000010010000010 | | 1 | 0000010010000010 | | 1 | 1000000100000000 | | 4 | 1000000100000000 | | 4 |
| 43 | 0000100010000001 | | 1 | 0000100010000001 | | 1 | 1001000001000100 | | 2 | 1001000001000100 | | 2 |
| 44 | 0000100100000010 | | 1 | 0000100100000010 | | 1 | 1001000000001001 | | 1 | 1000100000001001 | | 1 |
| 45 | 0001000100000001 | | 1 | 0001000100000001 | | 1 | 1001000010001000 | | 3 | 1001000010001000 | | 3 |
| 46 | 0001001000000010 | | 1 | 0001001000000010 | | 1 | 1001000100010000 | | 3 | 1001000100010000 | | 3 |

In the main table 122, if an input 8-bit main data value is included within the range from 0 to 87, any of the four types of states S1 to S4 shown in Table 1 is selected in accordance with the next state specified by the selector 125. A 16-bit main data word corresponding to the input 8-bit main data value is selected from the 16-bit main data words belonging to the selected state. Then, the selected 16-bit main data word DM is output to a cross-bar switch 126.

On the other hand, if an input 8-bit main data value is included within the range from 88 to 255 in the main table 122 and any of the two types of states S1 and S4 shown in Table 1 is selected in accordance with the next state specified by the selector 125, a 16-bit main data word corresponding to the input 8-bit main data value is selected from the 16-bit main data words belonging to the selected state S1 or S4. Then, the selected 16-bit main data word D1 or D4 is output to the cross-bar switch 126. Furthermore, if an input 8-input main data value is included within the range from 88 to 255 in the main table 122 and any of the two types of states S2 and S3 shown in Table 1 is selected in accordance with the next state specified by the selector 125, a 16-bit main data word corresponding to the input 8-bit main data value is selected from the 16-bit main data words belonging to the selected state S2 or S3. Then, the selected 16-bit main data word is output to the cross-bar switch 126.

Similarly, if an input 8-bit main data value is included within the range from 0 to 87 in the sub-table 123, any of the four types of states S1 to S4 shown in Table 2 is selected in accordance with the next state specified by the selector 125. And a 16-bit main data word corresponding to the input 8-bit main data value is selected from the 16-bit main data words belonging to the selected state. Then, the selected 16-bit main data word DS is output to the cross-bar switch 126.

At this time, not only the selected 16-bit data words but also the next states corresponding to these 16-bit data words are read out from the tables 122 and 123 and then output to the cross-bar switch 126.

It is noted that the next state is initialized to be 1 in response to a sync code at the beginning of a frame.

When an 8-bit main data value and the next state specified by the selector 125 are input to the DSV controller 124, the DSV controller 124 makes a decision based on the 8-bit main data value and the next state and then outputs a cross-bar switch select signal corresponding to the decision result to the cross-bar switch 126.

In response to the cross-bar switch select signal, the cross-bar switch 126 selects one or two main data word(s) from the 16-bit main data word provided from the main table 122 and the 16-bit main data word provided from the sub-table 123 and then outputs the one or two 16-bit main data word(s) to at lest one of a first DSV arithmetic circuit 127 and a second DSV arithmetic circuit 128.

For example, if the DSV controller 124 has determined that the 8-bit main data value is equal to or smaller than 87 and the 16-bit main data word corresponding to the 8-bit main data value exists in each of the main table 122 and the sub-table 123, then the cross-bar switch 126 selects the 16-bit main data words DM and DS from the main table 122 and the sub-table 123, respectively, in response to the cross-bar switch select signal. Then, the cross-bar switch 126 outputs the 16-bit main data words DM and DS to the first and the second DSV arithmetic circuits 127 and 128.

On the other hand, if the DSV controller 124 has determined that the 8-bit main data value is equal to or larger than 88, the 16-bit main data word corresponding to the 8-bit main data value exists only in the main table 122, and either the state S1 or the state S4 has been selected by the next state specified by the selector 125, then the cross-bar switch 126 selects the 16-bit main data word D1 or D4 supplied from the main table 122 in response to the cross-bar switch select signal. Then, the cross-bar switch 126 outputs the 16-bit main data word D1 or D4 to the first and the second DSV arithmetic circuits 127 and 128.

Furthermore, if the DSV controller 124 has determined that the 8-bit main data value is equal to or larger than 88, the 16-bit main data word corresponding to the 8-bit main data value exists only in the main table 122, and either the state S2 or the state S3 has been selected by the next state specified by the selector 125, then the cross-bar switch 126 selects only a single 16-bit main data word (or the 16-bit main data word which has been read out in accordance with either the state S2 or the state S3 specified by the next state) supplied from the main table 122 in response to the cross-bar switch select signal. Then, the cross-bar switch 126 outputs the 16-bit main data word D2 or D3 to the first DSV arithmetic circuit 127.

The selections made by the cross-bar switch 126 from the 16-bit main data words DM, D1, D4 and DS are classified as shown in the following Table 3.

TABLE 3

| Main Data Value | 0 to 87 | 88 to 255 | 88 to 255 |
|---|---|---|---|
| Next State | S1, S2, S3, S4 | S1 or S4 | S2 or S3 |
| Data Selection | Select DM from main table and DS from sub-table | Select D1 or D4 correspond-ing to S1 or S4 from main table | Always select DM specified by next state S2 or S3 from main table |

However, in the case where the 8-bit main data value is equal to or larger than 88 and either the state S1 or the state S4 has been selected in accordance with the next state specified by the selector 125, if the run length of successive codes having an equal sign between an 8-bit main data word and a previous 8-bit main data word is out of the range from 2 to 10 in either the state S1 or the state S4, then the DSV controller 124 controls the cross-bar switch 126 such that only a 16-bit main data word D1 or D4 belonging to the state S1 or S4 and having a run length within the range from 2 to 10 is selectively output. Thus, in order to output the 16-bit main data words D1 and D4 from the main table 122 to the first and the second DSV arithmetic circuits 127 and 128, the run length of the successive codes having an equal sign between an 8-bit main data word and a previous 8-bit main data word is required to be within the range of 2 to 10.

Every time a 16-bit main data word is input to the first arithmetic circuit 127 and/or the second arithmetic circuit 128, the arithmetic circuit(s) calculate(s) a digital sum value (DSV) associated with the input 16-bit main data word. The algorithm used for calculating the DSV is as follows.

For example, if a 16-bit main data word such as that shown in FIG. 21A is input from the cross-bar switch 126 to a PWM modulator 129 via the selector 125, the PWM modulator 129 performs a pulse width modulation on the 16-bit main data word, thereby producing and outputting a 16-bit output main data word such as that shown in FIG. 21B.

As can be seen from the comparison between FIGS. 21A and 21B, the number of "1" bits and the number of "0" bits included in a single output main data word can be derived from a single 16-bit input main data word. Thus, every time a single 16-bit main data word is input, the number of "1" bits and the number of "0" bits included in a single output main data word corresponding to the single 16-bit input main data word are obtained and then the difference between the numbers is calculated. The differences calculated for the respective words are accumulated, thereby obtaining a DSV. The DSVs calculated by the first and the second DSV arithmetic circuits 127 and 128 are supplied to the selector 125 and a comparator 130. In actuality, the "1" bit included in a single output main data word is replaced by a value "+1" and the "0" bit included in the single output main data word is replaced by a value "−1". The total sum of the values "+1" and "−1" is calculated in each output main data word. Then, the sums are accumulated for the respective words, thereby obtaining the DSV.

In addition, the calculation is performed by the first and the second DSV arithmetic circuits 127 and 128 on a sector basis, and is continuously performed from the beginning to the end of a single sector. At the beginning of a sector, the first bit (or the least significant bit LSB) of the sector is input from the PWM modulator 129 to the first and the second DSV arithmetic circuits 127 and 128 and the first value of the output main data word is initialized or set to be equal to zero in response to the bit LSB.

When the DSVs are input from the first and the second DSV arithmetic circuits 127 and 128 to the comparator 130, the comparator 130 selects either one of the DSVs having a smaller absolute value and then provides the information indicating the arithmetic circuit 127 or 128 which has calculated the selected DSV for the selector 125. In response to the information, the selector 125 selects the arithmetic circuit 127 or 128 indicated by the comparator 130, outputs the 16-bit output main data word from which the DSV has been calculated by the arithmetic circuit 127 or 128 to the PWM modulator 129, and outputs the next state associated with the 16-bit output main data word to the main table 122, the sub-table 123 and the DSV controller 124.

That is to say, in the 8/16 modulator 102, 8-bit input main data words are modulated into corresponding 16-bit main data words, the DSV of the respective output main data words corresponding to the 16-bit main data words is calculated beforehand, the 16-bit main data words, from which a smaller DSV can be derived, are selected and then the 16-bit main data words are modulated into the 16-bit output main data words so as to be output. However, as mentioned above, if the 16-bit main data word corresponding to the input 8-bit main data value exists only in the main table 122 and either the state S2 or the state S3 has been selected by the next state specified by the selector 125, then only a single 16-bit main data word (or the 16-bit main data word which has been read out in accordance with either the state S2 or the state S3 specified by the next state) is selected from the main table 122. Thus, the modulation from the 16-bit main data word to the 16-bit output main data word is performed.

A series of processing steps performed by such a code conversion apparatus will be described with reference to the flow charts shown in FIGS. 22 and 23.

First, after the top of a frame has been identified by counting the respective bits of an input main data word (Step 201), a sync code is added to the top of the frame (Step 202) and the next state output from the selector 125 of the 8/16 modulator 102 is initialized to be S1 (Step 203). Then, if it is determined that the end of a sector has not been reached (Step 204, NO), then the processing returns to Step 201.

Subsequently, the scrambling of the frame of the input main data word is started (Step 205) and the frame of the scrambled main data word is converted into the frame of an output main data word on a word basis (Step 206). Then, if the top of the next frame is identified (Step 201), a sync code is added to the top of the frame (Step 202) and the next state is initialized again to be S1 (Step 203). Next, the scrambling and the conversion are performed (Steps 205 and 206). From then on, similar processing is repeatedly performed on the respective frames. And when the end of a sector has been reached (Step 204, YES), the processing of one sector ends.

Moreover, after Step 206 has been performed, it is also determined whether or not the 8-bit main data value is smaller than 88. As shown in FIG. 23, if the value is smaller than 88 (Step 301, YES), then a 16-bit main data word having a smaller DSV is selected from the 16-bit main data word DM supplied from the main table 122 and the 16-bit main data word DS supplied from the sub-table 123 (Step 302).

On the other hand, if the 8-bit main data value is equal to or larger than 88 (Step 301, NO), then a 16-bit main data word D1 or D4 having a smaller DSV is selected from the main table 122 (Step 303).

If an output main data word always having a smaller DSV is produced in this manner, then the low frequency components of the main data word are reduced. Thus, in a recording/reproducing apparatus for recording and/or reproducing the main data word onto/from a recording medium, the low frequency components of a reproduced signal can be reduced, the shift of the envelope of the reproduced signal can be suppressed, and a reproduction error can be prevented to a certain degree.

However, though the above-described prior art code conversion apparatus can surely reduce the low frequency components of a reproduced signal and the possibility of the abnormal increase of the low frequency components, the degree of the reduction is not satisfactorily high and a reproduction error may continue to occur in some cases.

More specifically, when there are M types of 16-bit main data words in the 8/16 modulator 102 shown in FIG. 20. N types of 16-bit main data words having bit patterns causing the DSV to diverge are included in the M types of 16-bit main data words. Thus, if 16-bit main data words having such bit patterns successively appear, then the DSV adversely increases or decreases to diverge. As a result, the low frequency components of the output main data words are disadvantageously increased.

In the above-described conventional example, M=256 and N=168. When the 8-bit main data value is within the range from 0 to 87, the DSV converges. On the other hand, when the 8-bit main data value is in the range from 88 to 255, the DSV diverges. In actuality, the divergence of the DSV occurs in about 10% of the entire main data. FIG. 24A is a graph showing the variation of the 8-bit main data values in one sector and FIG. 24B is a graph showing the increase and the decrease of the DSV in accordance with the variation of the 8-bit main data values. As can be seen from these graphs, if the 8-bit main data values are continuously included within the range from 88 to 255, the DSV diverges.

That is to say, in the prior art code conversion apparatus, though the input main data is scrambled and the scrambled main data is subjected to an 8/16 modulation, the low frequency components of the main data cannot be satisfactorily reduced. Consequently, when the main data is reproduced from a recording medium on which the main data has been recorded, the low frequency components of the reproduced signal increase, the envelope of the reproduced signal abruptly varies, and a reproduction error occurs. Even if the envelope of the reproduced signal is corrected or the main data is corrected by using an error correction code (ECC) to be added thereto, such a reproduction error cannot be totally prevented.

In addition, since a set of pseudo-random number sequences are sequentially rearranged in a predetermined order, it is possible that substantially the same signal is repeatedly rewritten on the same sector. In such a case, since the characteristics of a part of the recording medium occupied by the sector in question become nonuniform, the S/N ratio of the reproduced signal is decreased and a reproduction error occurs in some cases.

SUMMARY OF THE INVENTION

A code conversion method and apparatus is provided for scrambling and modulating data. The method and apparatus includes scrambling an input main data unit based on any of plural types of pseudo-random number sequences, and modulating the scrambled main data unit based on any of plural types of modulation data. An output main data unit is produced from the modulated main data unit, and a calculated value representing a difference between a number of 0 bits and a number of 1 bits included in the output main data unit is obtained. Any of the modulation data is then selected dependent upon the calculated value. The method and apparatus further includes determining whether or not a variation of the calculated value has exceeded a predetermined threshold, newly selecting another pseudo-random number sequence used for the step of scrambling if it is determined that the variation of the calculated value has exceeded the predetermined threshold value, and re-scrambling the input main data unit based on the newly selected pseudo-random number sequence.

Hereinafter, the functions or the effects to be attained by the present invention will be described.

First, according to the code conversion method of the present invention, if the variation of the calculated value representing a difference between the number of "0" bits and the number of "1" bits in the output main data word (i.e., the variation of a DSV) had exceeded the threshold value, another pseudo-random number sequence is newly selected and then the input main data word is re-scrambled. Thus, the pseudo-random number sequence is repeatedly changed and the scrambling is repeatedly performed until the DSV becomes equal to or smaller than the threshold value. As a result, the increase of DSV can be prevented and the low frequency components of the output main data word can be reduced. Therefore, when such an output main data word is recorded onto a recording medium and a signal is reproduced from the recording medium, it is possible to reduce the low frequency components of the reproduced signal and to prevent a reproduction error.

In addition, the second pseudo-random number sequences used for the step of re-scrambling are assumed to be pseudo-random number sequences making it possible to obtain a plurality of main data words not having the bit pattern causing the increase of DSV at a ratio equal to or larger than (M−N)/M. By obtaining the words not having the bit pattern in question at a ratio at least equal to (M−N)/M in this manner, the variation of the DSV can be reduced to a practical level.

Moreover, if the scrambling is repeatedly performed by using the same first scramble data during the second period H and if the DSV exceeds the threshold value during the first period L shorter than the second period H, at least the same number of different types of second scramble data as H/L=J are set. Then, even if the DSV has exceeded the threshold value during any first period L other than the current first period L to which arbitrary second scramble data is applied, another second scramble data not causing the increase of the DSV can be identified among the J types of second scramble data.

Next, according to the code recording medium of the present invention, since scramble data and scrambled main data are recorded on a sector basis, the scramble data and the scrambled main data can be read from an arbitrary sector and the scrambled main data can be restored into original data in accordance with the scramble data. Thus, the initial value of any arbitrary pseudo-random number sequence may be recorded as the scramble data onto each sector. Moreover, since the scramble data represents the initial value of the pseudo-random number sequence and the pseudo-random number sequence is composed of random numbers beginning with the initial value, the main data can be recorded after the main data has been sufficiently scrambled. As a result, the low frequency components of a signal to be recorded onto a sector can be reduced and it is possible to prevent the same signal from being repeatedly written onto the same sector.

In addition, the main data is not always required to be scrambled and may be recorded and/or reproduced as it is.

As a result, the scramble data may be changed irregularly.

Thus, the invention described herein makes possible the advantages of (1) providing code conversion method and apparatus which can reduce the low frequency components of a signal to be recorded onto a recording medium by controlling the pseudo-random number sequences such that the divergence of a DSV can be suppressed and that substantially the same signal is not repeatedly rewritten onto the same sector, (2) providing a code conversion recording medium onto/from which a signal is recorded/reproduced in accordance with the improved code conversion method of the present invention, and (3) providing a code conversion recording/reproducing apparatus used for recording/reproducing the signal onto/from such a recording medium.

These and other advantages of the present invention will become apparent to those skilled in the art upon reading and understanding the following detailed description with reference to the accompanying figures.

BRIEF DESCRIPTION OF THE DRAWINGS

FIG. 14 is an exemplary data table for an initial value data generator of the code recording apparatus shown in FIG. 12.

FIG. 15 is another exemplary data table for the initial value data generator of the code recording apparatus shown in FIG. 12.

FIG. 21A is a time chart showing the waveform of a 16-bit main data word, while FIG. 21B is a time chart showing the waveform of a 16-bit output main data word produced by modulating the main data word shown in FIG. 21A by means of a pulse width modulation.

FIG. 24A is a graph showing the variation of a main data value in a conventional code conversion apparatus, while

DESCRIPTION OF THE PREFERRED EMBODIMENTS

Hereinafter, the embodiments of the present invention will be described with reference to the accompanying drawings.

EXAMPLE 1

Figure 1:
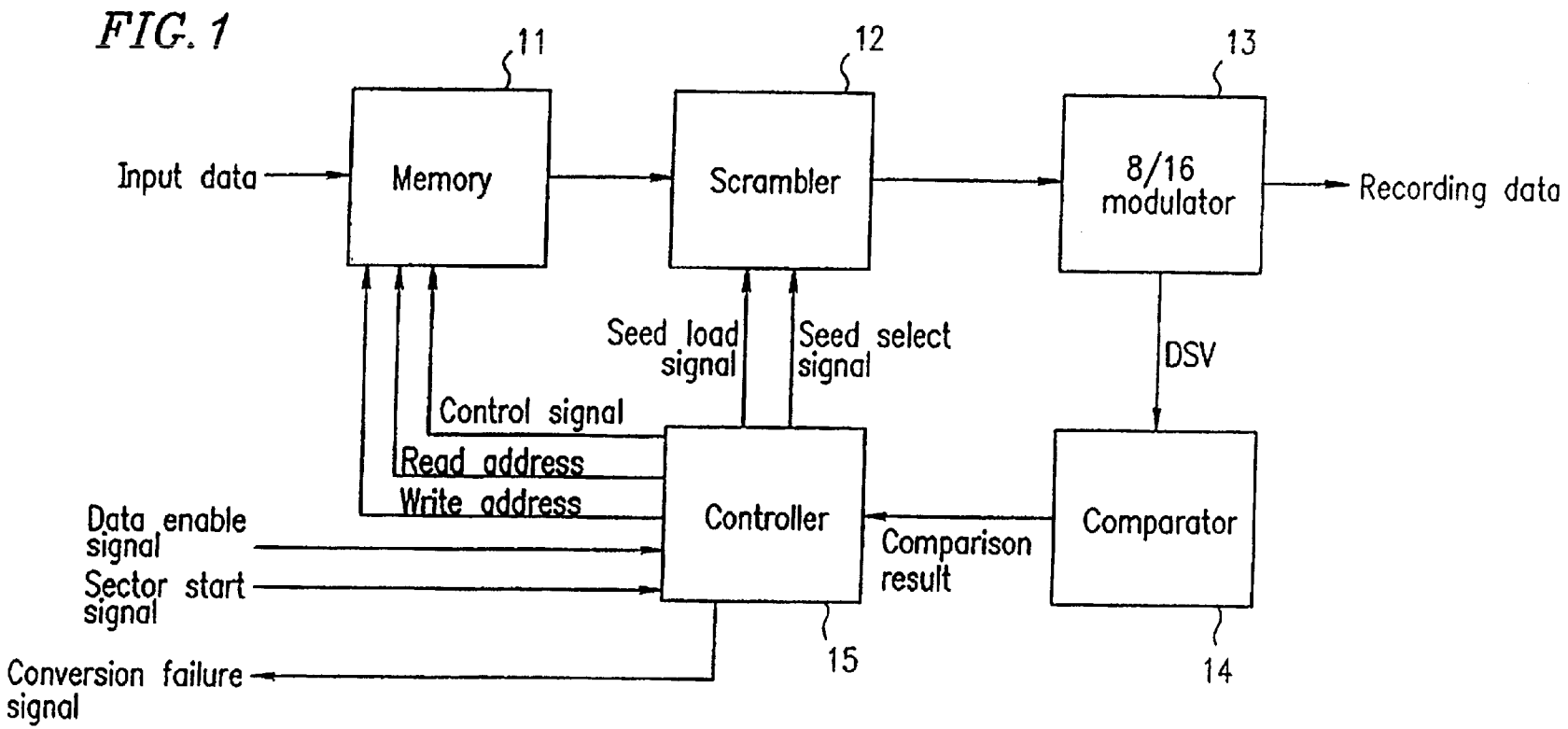
FIG. 1 is a block diagram showing a code conversion apparatus in a first example of the present invention.

FIG. 1 shows a code conversion apparatus in a first example of the present invention. In FIG. 1, a memory 11 stores an input main data words and can store at least two sectors of main data words. When the main data word stored in the memory 11 is input to a scrambler 12, the scrambler 12 scrambles the input main data word and then outputs the scrambled main data word to an 8/16 modulator 13. The 8/16 modulator 13 modulates the scrambled main data word by means of a pit position modulation (PPM), thereby producing a main data word (16 bits) from the scrambled main data word (8 bits). Then, the 8/16 modulator 13 further modulates the 16-bit main data word by means of a pulse width modulation (PWM), thereby producing a 16-bit output main data word from the 16-bit main data word and outputting the 16-bit output main data word. When the DSV obtained by the 8/16 modulator 13 is input to a comparator 14, the comparator 14 determines whether or not the variation (or the differential value) of the DSV has exceeded a predetermined threshold value and then outputs the determination result to a controller 15.

The controller 15 controls the overall operation of the code conversion apparatus. More specifically, the controller 15 defines a write address used for writing an input main data word to the memory 11 and a read address used for reading the stored main data word from the memory 11, changes the initial bit pattern of a pseudo-random number sequence in the scrambler 12, and outputs a conversion failure signal.

Figure 19:
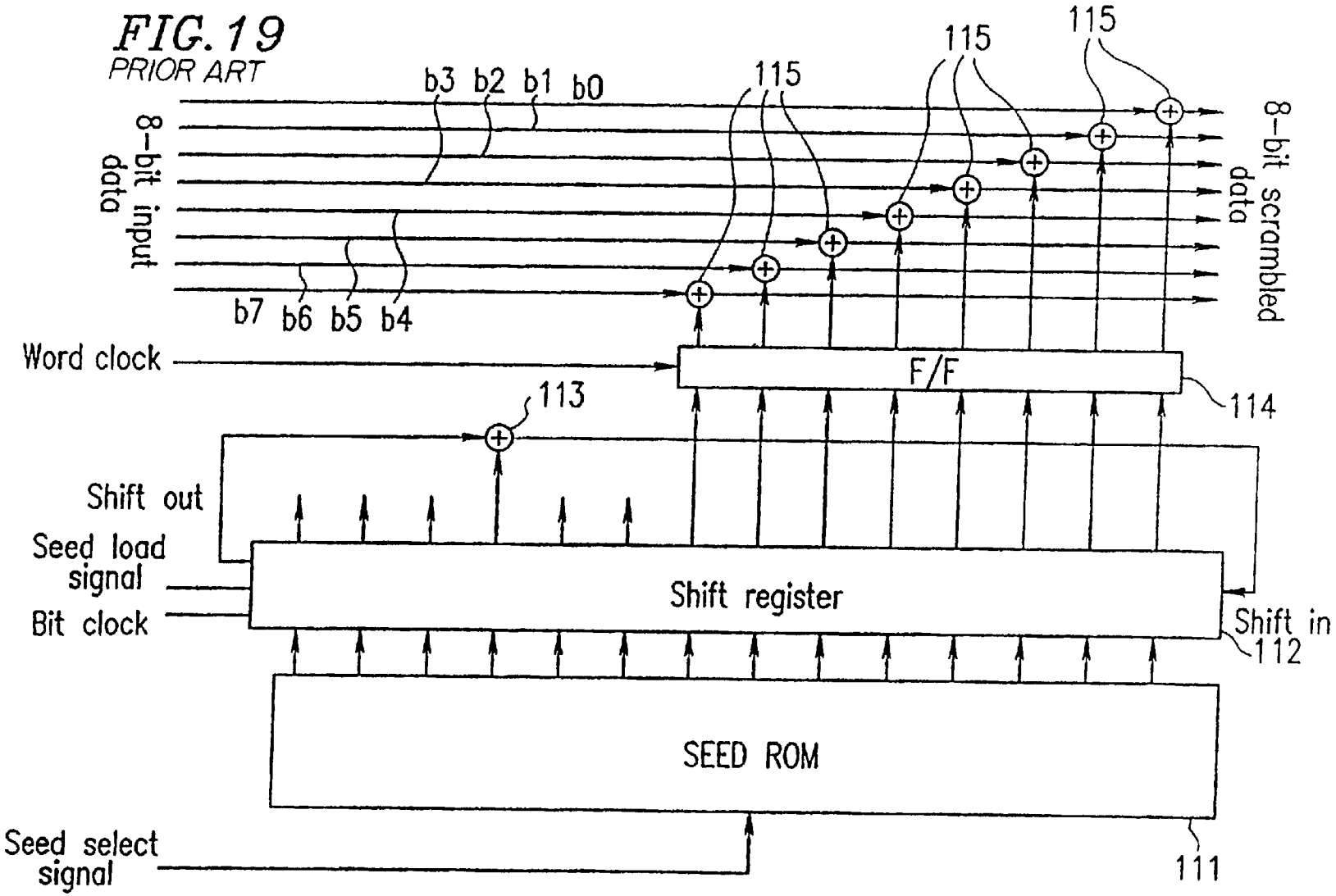
FIG. 19 PRIOR ART
FIG. 19 is a block diagram showing in detail a scrambler of the conventional code conversion apparatus shown in FIG. 18.

The scrambler 12 is configured in the same way as the scrambler 101 shown in FIG. 19 and includes a seed ROM 111, a shift register 112, an exclusive-OR element 113, a flip-flop 114 and a plurality of exclusive-OR elements 115. Thus, when an 8-bit main data word is input to the scrambler 12, the scrambler 12 scrambles the input 8-bit main data word and then outputs the scrambled main data word.

Figure 20:
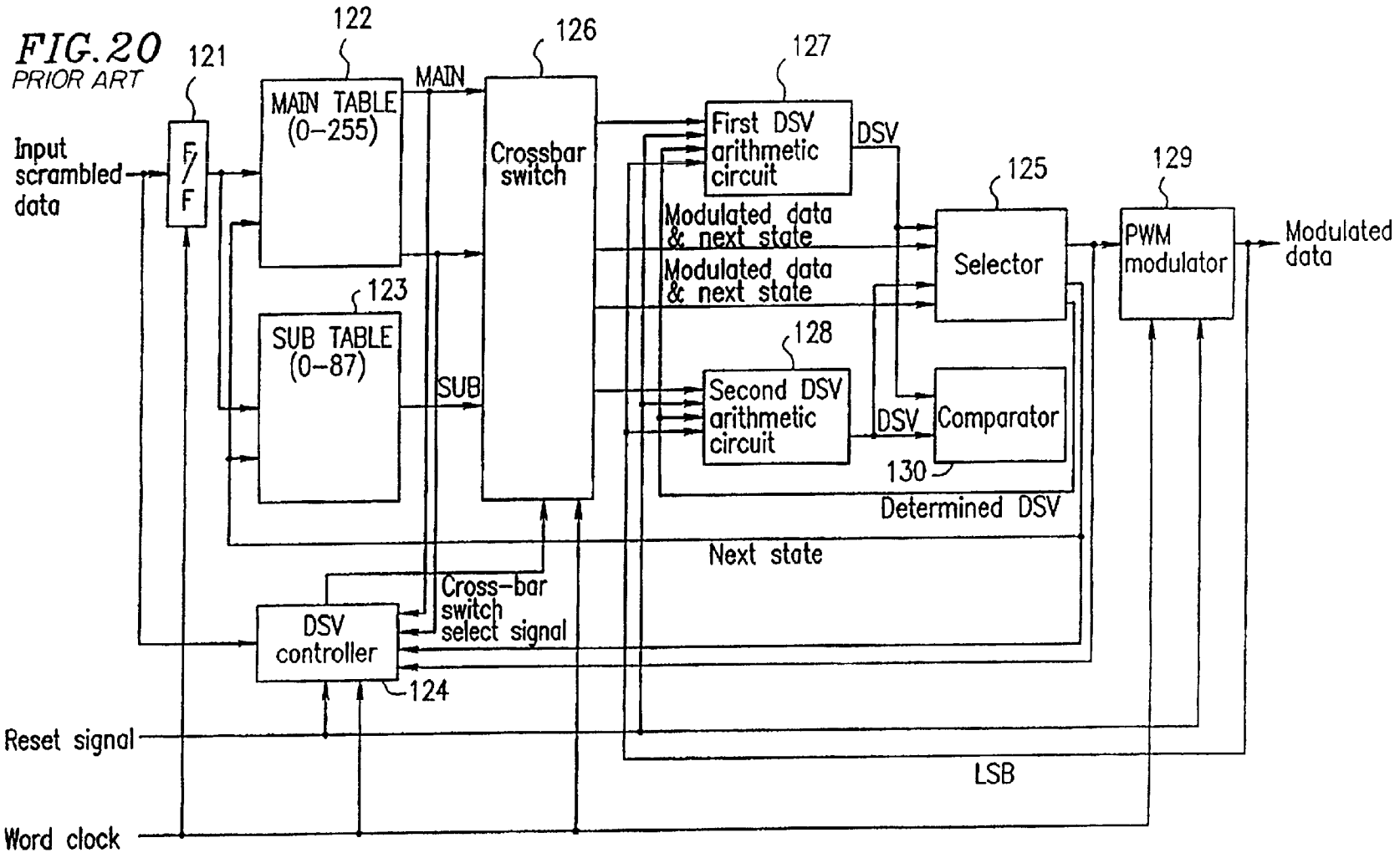
FIG.20 PRIOR ART
FIG. 20 is a block diagram showing in detail an 8/16 modulator of the conventional code conversion apparatus shown in FIG. 18.
Figures 21A, 21B:
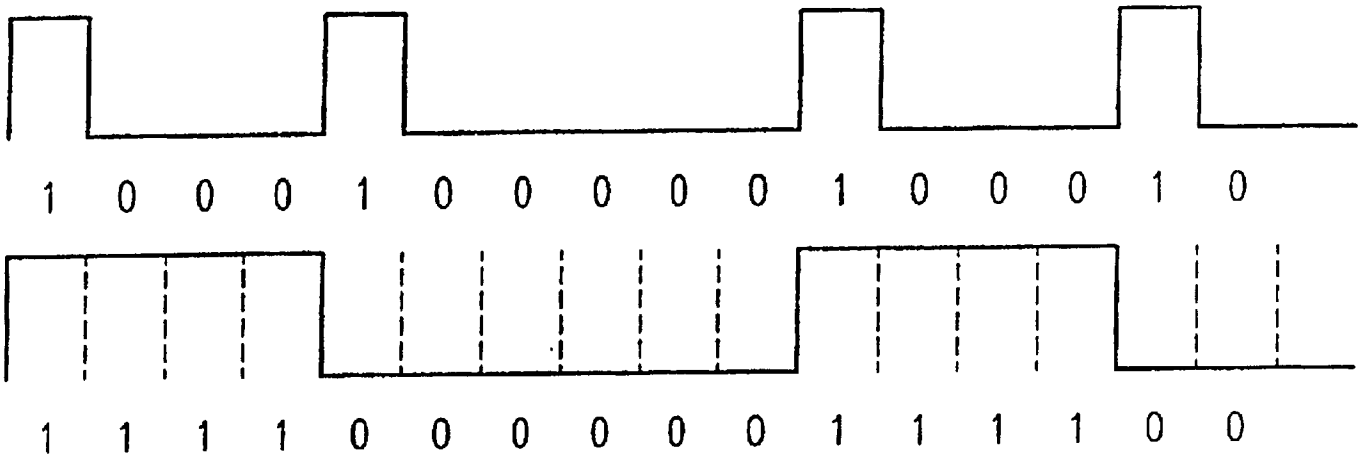
FIG. 21A PRIOR ART
FIG. 21B PRIOR ART
Figure 22:
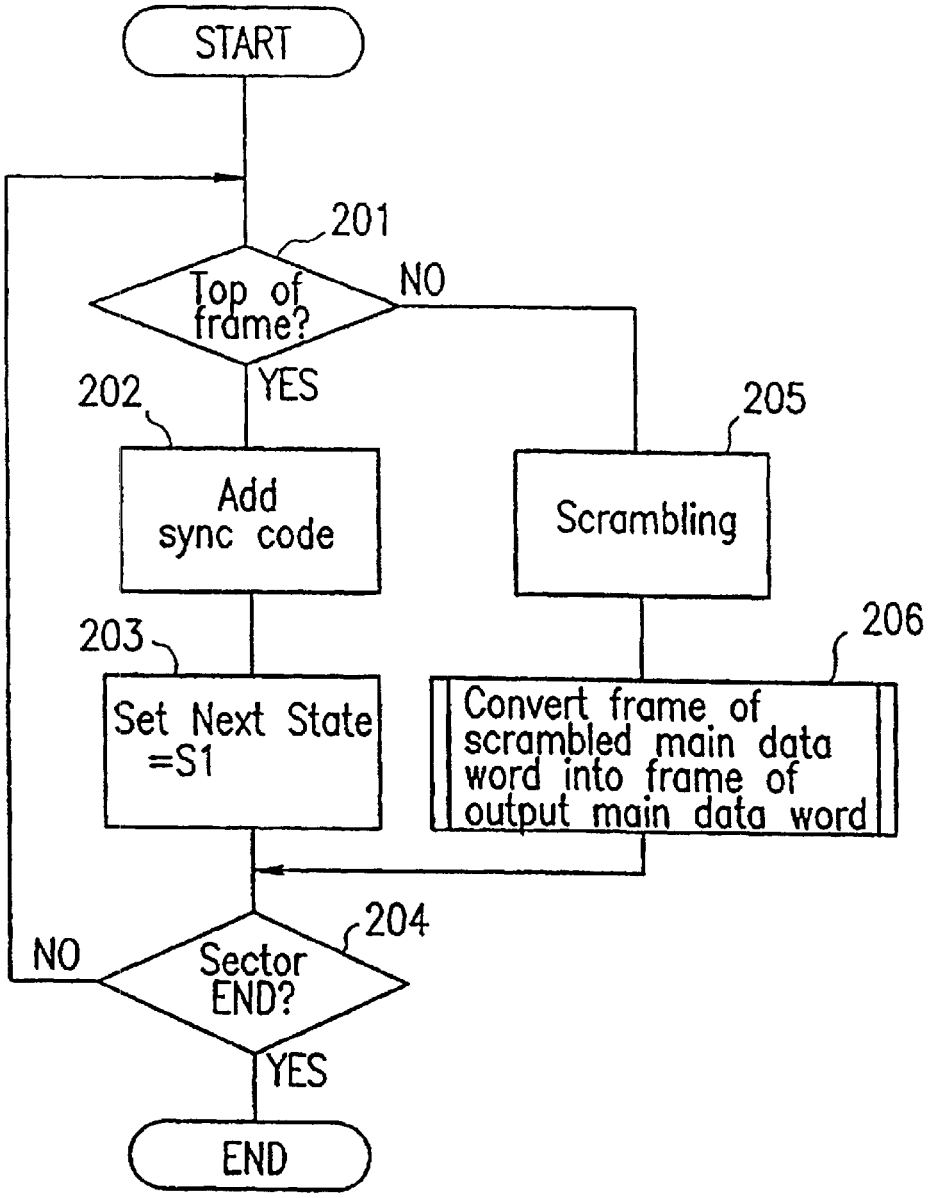
FIG. 22 PRIOR ART
FIG. 22 is a flow chart showing exemplary processing of a conventional code conversion apparatus.
Figure 23:
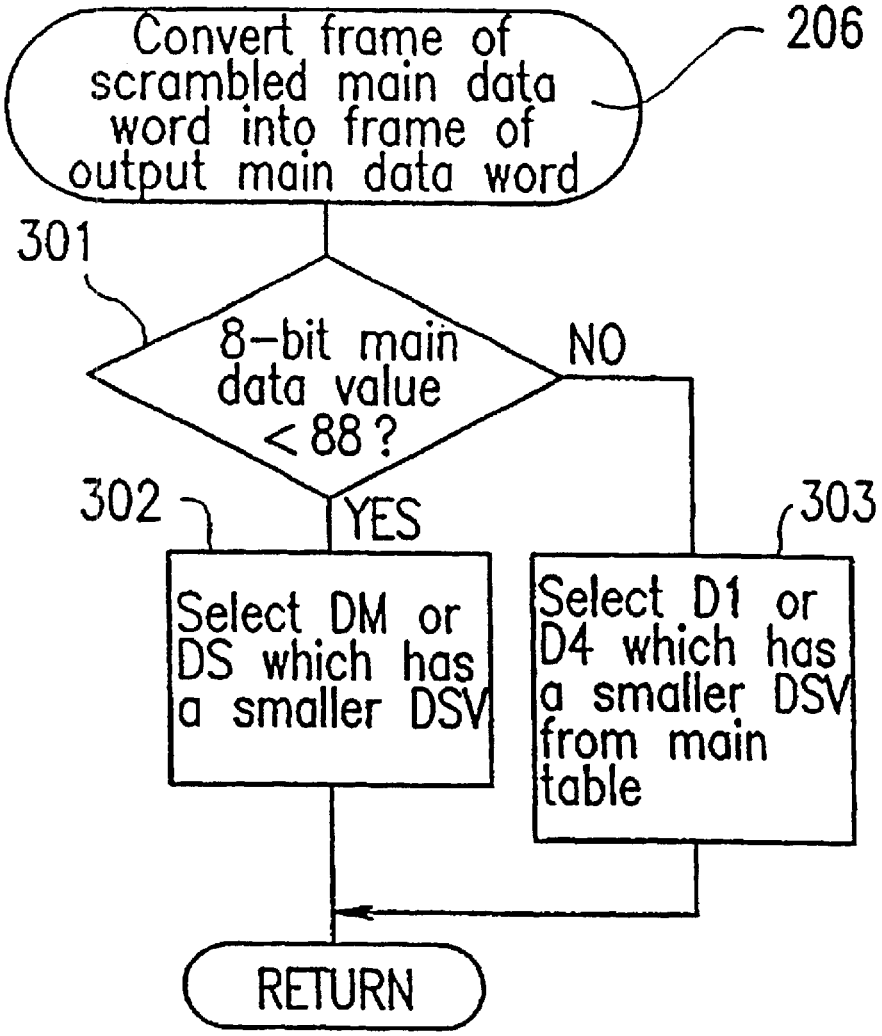
FIG. 23 PRIOR ART
FIG. 23 is a flow chart showing another exemplary processing of the conventional code conversion apparatus.
Figure 24A:
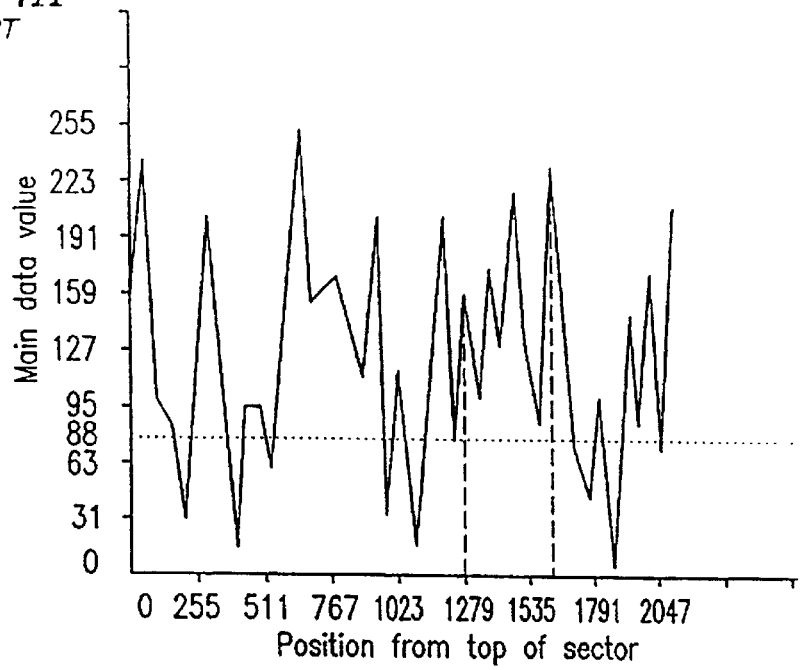
FIG. 24A PRIOR ART
Figure 24B:
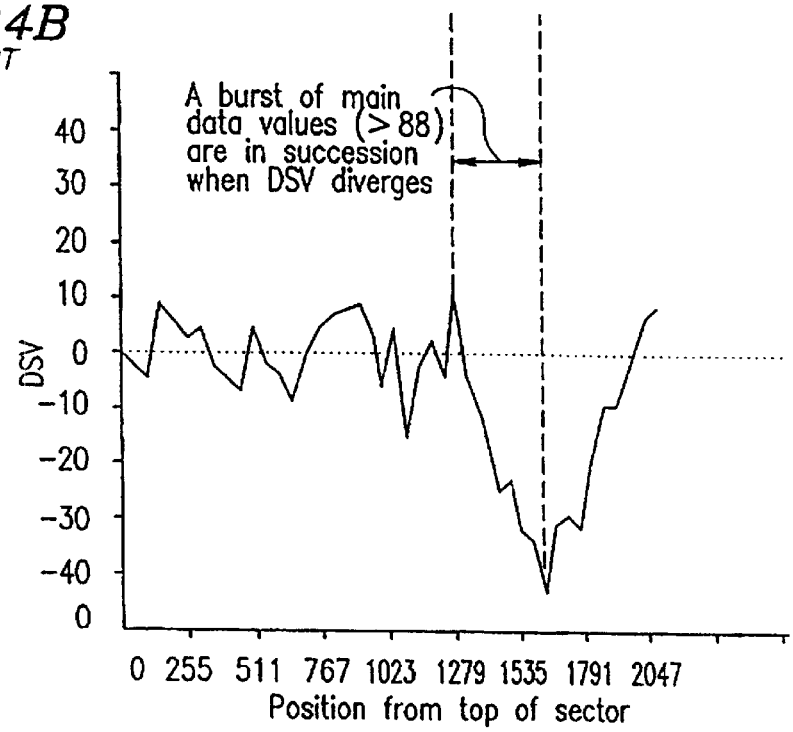
FIG. 24B PRIOR ART
FIG. 24B is a graph showing the variation of a DSV in accordance with the variation shown in FIG. 24A.

The 8/16 modulator 13 is also configured in the same way as the 8/16 modulator 102 shown in FIG. 20 and includes a flip-flop 121, a main table 122, a sub-table 123, a DSV controller 124, a selector 125, a crossbar switch 126, a first and a second DSV arithmetic circuit 127 and 128, a PWM modulator 129 and a comparator 130. Thus, the 8/16 modulator 13 also modulates an 8-bit input main data word into a 16-bit main data word, further modulates the 16-bit main data word into an output 16-bit main data word and then outputs the 16-bit output main data word.

Figure 2:
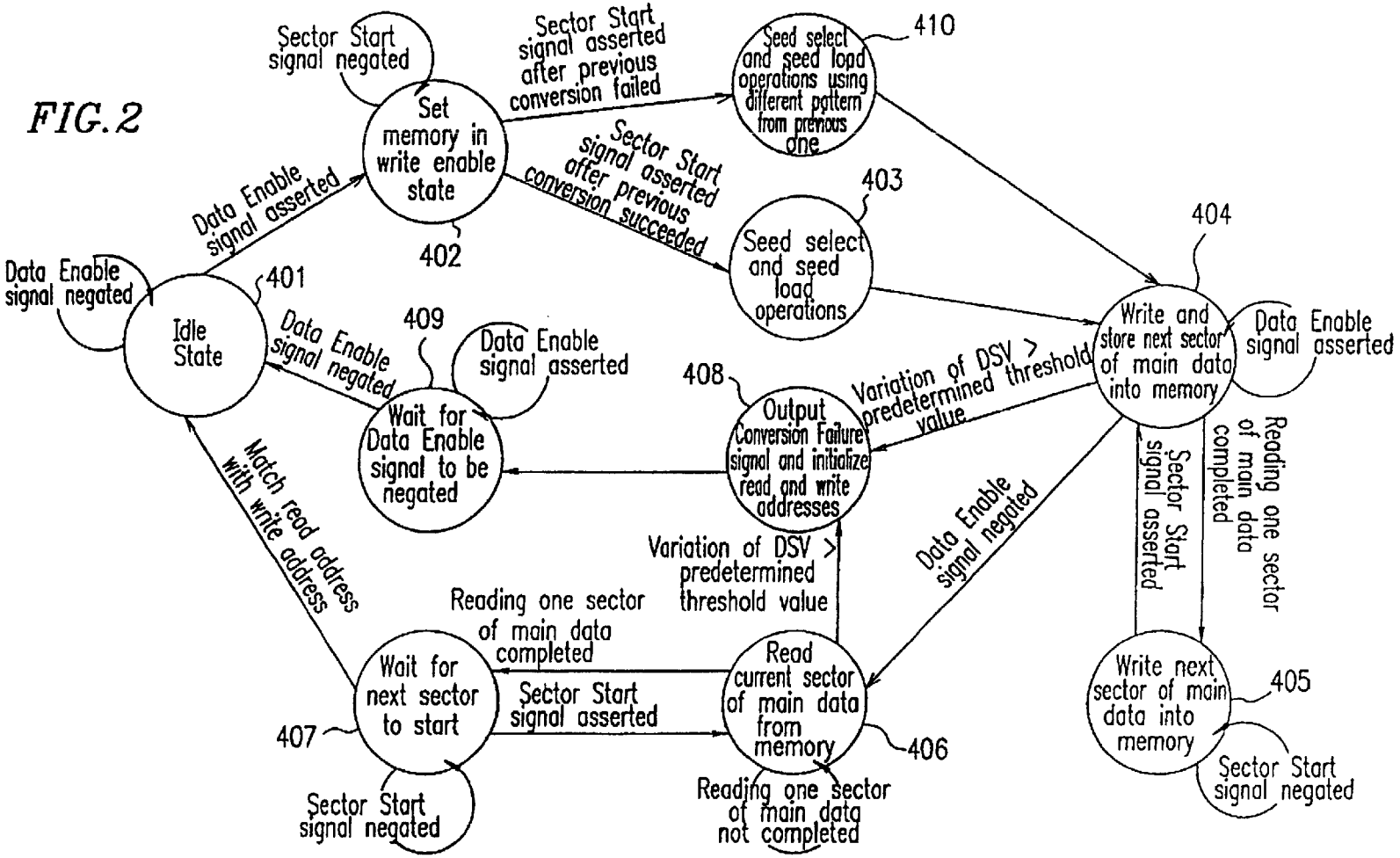
FIG. 2 is a state transition diagram illustrating the operation procedure of the code conversion apparatus shown in FIG. 1.

The operation of a code conversion apparatus having such a configuration will be described with reference to a state transition diagram shown in FIG. 2.

First, the controller 15 is in an idle state (State 401). When a data enable signal is asserted, the memory 11 is set in a write enable state (State 402), thereby starting storage of a sector of main data in the memory 11. When a sector start signal is asserted, the controller 15 starts reading a sector of main data from the memory 11 and supplies the read main data word to the scrambler 12. The controller 15 also supplies a seed select signal and a seed load signal to the scrambler 12 (State 403). The initial bit patterns of predetermined pseudo-random number sequences are stored beforehand in the scrambler 12. The scrambler 12 selects any of these initial bit patterns in response to the seed select signal, and generates a series of random numbers beginning with the selected initial bit pattern in response to the seed load signal. Then, the scrambler 12 scrambles the respective main data words in accordance with the series of random numbers and sequentially outputs the scrambled main data words to the 8/16 modulator 13.

Figure 18:
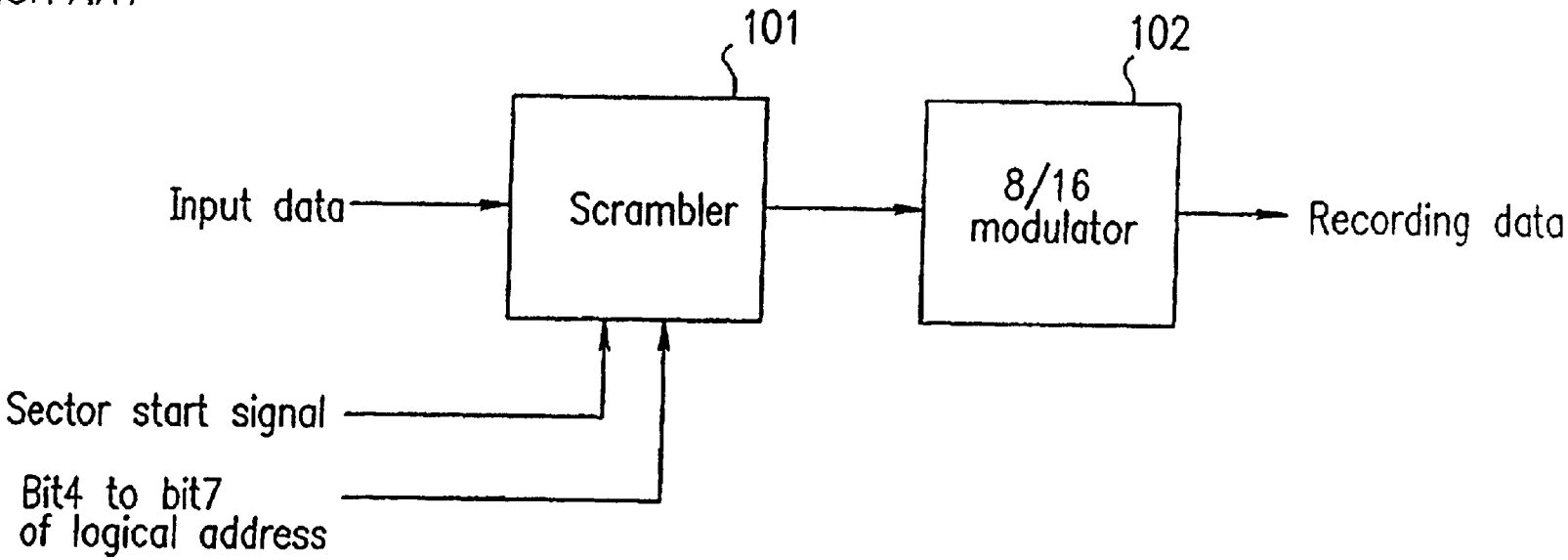
FIG. 18 PRIOR ART
FIG. 18 is a block diagram showing a conventional code conversion apparatus.

It is noted that the initial bit pattern of a pseudo-random number sequence may be set initially in accordance with the higher 4 bits of a logical address associated with the input main data word in the same way as in the conventional code conversion apparatus shown in FIG. 18.

The 8/16 modulator 13 sequentially modulates the scrambled main data words by means of the PPM, thereby producing a main data word (16 bits) from each of the scrambled main data words (8 bits). Then, the 8/16 modulator 13 further modulates the 16-bit main data word by means of the PWM, thereby producing a 16-bit output main data word from the 16-bit main data word and outputting the 16-bit output main data word. Furthermore, the 8/16 modulator 13 obtains a DSV for the respective main data words by means of an accumulation and then outputs the DSV to the comparator 14. Then, the comparator 14 determines whether or not the variation of the DSV has exceeded a predetermined threshold value and then outputs the determination result to the controller 15.

While one sector of main data is read out from the memory 11 and the scrambling and the modulation of the main data word are performed, a next sector of main data is written into and stored in the memory 11 (State 404).

After the read of the one sector of main data from the memory 11 has been completed, only the write of the next sector of main data into the memory 11 is continued (State 405). And when the write is completed and a sector start signal is asserted, the processing returns to State 404 and another sector of main data is read out, scrambled and modulated.

If a next sector of main data is no longer input in State 404, only the read of the current sector of main data from the memory 11 is continued (State 406). When the read of the current sector is completed, the controller 15 enters a wait state to wait for a next sector of main data (State 407) and matched the read address with the write address so as to return to the idle state (State 401).

In this manner, the respective sectors of main data words are sequentially stored in the memory 11 and then these sectors of main data words are sequentially read out from the memory 11. Then, these sectors of main data words are sequentially scrambled, modulated and output. After sync codes are inserted between adjacent frames of each main data word output in this manner and an error correction code is added to each main data word, the main data word is output to a recording section 24 of a recording/reproducing apparatus shown in FIG. 3. The recording/reproducing apparatus records the main data word onto a recording medium on a sector basis.

On the other hand, if the comparator 14 has determined that the variation of the DSV has exceeded a threshold value (or the DSV has diverged so that the low frequency components of the main data word output from the 8/16 modulator 13 have increased) during the scrambling and the modulation of one sector of main data (States 404 and 406), the controller 15 initializes the write address and the read address for the memory 11 and outputs a conversion failure signal in response to the comparison result (State 408). The conversion failure signal is output to the 8/16 modulator 13 and to a drive control section 26 and an error correction code modulation section 22 of the recording/reproducing apparatus shown in FIG. 3.

The conversion failure signal is input to the 8/16 modulator 13 as a reset signal, thereby initializing the 8/16 modulator 13. Also, in response to the conversion failure signal, the recording/reproducing apparatus stops recording the sector and re-starts recording the sector. Furthermore, in response to the conversion failure signal, the main data word at the beginning of the sector is newly supplied to a circuit on the first stage (or the error correction code modulation section 22 of the recording/reproducing apparatus).

Then, the controller 15 waits for the write into the memory 11 to be disabled (State 409). When the write is disabled, the processing returns to State 402 via State 401. Next, the controller 15 re-starts reading one sector of main data in which the DSV has previously diverged, supplies the main data word to the scrambler 12 and outputs the seed select signal and the seed load signal to the scrambler 12 (State 410). In this State 410, the controller 15 outputs a seed select signal instructing the initial bit pattern of a different pseudo-random number sequence (from the pseudo-random number sequence which has caused the divergence of the DSV) to the scrambler 12 such that the one sector of main data in question is scrambled by the different pseudo-random number sequence. In response to the seed select signal, the scrambler 12 generates a series of random numbers beginning with the different initial bit pattern, sequentially scrambles the main data words in accordance with the series of random numbers, and then sequentially outputs the scrambled main data words to the 8/16 modulator 13. As described above, the 8/16 modulator 13 modulates the scrambled main data words and produces and outputs the output main data words and produces and outputs the output main data words. Furthermore, the 8/16 modulator 13 obtains a DSV by means of the accumulation and then outputs the DSV to the comparator 14.

Thereafter, the respective States 401 to 410 are repeatedly performed, the initial bit patterns of the pseudo-random number sequences are repeatedly changed and the same sector of main data is repeatedly scrambled and modulated until the variation of the DSV becomes equal to or smaller than the threshold value. As a result, the sector of main data is converted and recorded by the recording/reproducing apparatus onto the recording medium after establishing a state where the variation of the DSV does not exceed the threshold value, i.e., a state where the low frequency components of the sector of the main data word output from the 8/16 modulator 13 have been sufficiently reduced. Thus, when a signal is reproduced from the recording medium, the low frequency components of the reproduced signal are sufficiently small so that a reproduction error can be satisfactorily prevented.

Since a main data value is input on an 8 bit basis in the above-described 8/16 modulation, the main data value is any of "0" to "255". Thus, the same nubmer of 16-bit main data values must be set beforehand so as to correspond to these values of "0" to "255". In other words, 256 types of main data modulation patterns must be set beforehand.

On the other hand, in a 16-bit main data word, a DSV tends to converge with respect to a part of bit patterns having higher 2 bits of "00" or a part of bit patterns having higher 2 bits of "01", whereas a DSV is likely to diverge with respect to another part of the bit patterns having higher 2 bits of "00" or another part of the bit patterns having higher 2 bits of "01". There are 168 types of bit patterns which are more likely to cause the divergence of the DSV. Thus, 168 types of modulation patterns out of the 256 types of modulation patterns are more likely to cause the divergence of the DSV.

Herein, the number of words to be output during a predetermined first period L (which is shorter than one sector period of main data word) is assumed to be G, the number of all the modulation patterns for the input main data words to be M and the number of the modulation patterns which are more likely to cause the divergence of the DSV to be N. If the number of the words including no bit patterns which are more likely to cause the divergence of the DSV is larger than $G\times(M-N)/M$, then the DSV does not diverge during the first period L. For example, the number of the words to be output during the first period L is assumed to be 45. In such a case, $45\times(256-168)/256$ is larger than 15 and smaller than 16. Thus, if at least 16 words out of the 45 words do not include any bit pattern which is more likely to cause the divergence of the DSV, then it is possible to suppress the divergence of the DSV during the first period L to a practical level.

Consider a case where the scrambling and the modulation are repeatedly performed on the same sector of main data twice or more. In such a case, if the initial pseudo-random number sequence is called a "first pseudo-random number sequence" and the next pseudo-random number sequence is called a "second pseudo-random number sequence", then it is preferable that the second pseudo-random number sequence is applied to such a number of words including no bit patterns which are more likely to cause the divergence of the DSV as to be larger than $G\times(M-N)/M$.

Furthermore, if one sector period of main data words is called a "second period" H, at least the same number of different types of second pseudo-random number sequences as $H/L=J$ are preferably set beforehand. Then, even if the divergence of the DSV is caused during any first period L subsequent to the current first period L to which arbitrary second pseudo-random number sequence is applied, the divergence of the DSV during the first period L in question can be suppressed by any second pseudo-random number sequence other than the arbitrary second scramble data.

That is to say, the second pseudo-random number sequences are set such that, when the respective random numbers to be generated in the words corresponding to the respective first periods L based on the first pseudo-random number sequence are compared with the respective random numbers to be generated in the words corresponding to the respective first periods L based on the second pseudo-random number sequence, the former random numbers are different from the latter random numbers in such a number of times as to be at least larger than $G\times(M-N)/M$. Such second pseudo-random number sequences are determined for the respective first periods L, thereby setting at least the same number of different types of second pseudo-random number sequences as $H/L=J$.

In general, in the first periods L in which the divergence of the DSV has been caused, the divergence has been caused in all of the words corresponding to the first periods L. Thus, if the random numbers to be generated based on the first pseudo-random number sequence are different from the random numbers to be generated based on the second pseudo-random number sequence in such a number of times as to be larger than G×(M−N)/M, then these words can be sufficiently scrambled, thereby suppressing the divergence of the DSV in these first periods L in which the divergence of the DSV has been caused. Moreover, even if the DSV has diverged in any other first period L, the divergence of the DSV in the first period L in question can be suppressed by any other second pseudo-random number sequence.

However, it should be noted that the random numbers to be generated based on the first pseudo-random number sequence and the random numbers to be generated based on the second pseudo-random number sequence which are different from the former random numbers must be able to scramble the bit patterns which are included in the respective words and are likely to cause the divergence of the DSV in mutually different manners.

Such a suppression is realized, for example, by applying the following generating polynomial (2) to the scrambler 12 such that the first pseudo-random number sequence and J types of second pseudo-random number sequences may be set. However, it should be noted that the capacities of the seed ROM 111, the shift register 112 and the flip-flop 114 are required to be increased.

$$X^{31}+X^{25}+X^{20}+X^{5}+1 \quad (2)$$

In the code conversion apparatus of the first example, it is determined whether or not the variation of the DSV has exceeded the threshold value. Alternatively, it may be determined whether or not the absolute value of the DSV has exceeded the threshold value and then the same one sector of main data may be re-scrambled in accordance with the determination result.

Figure 3:
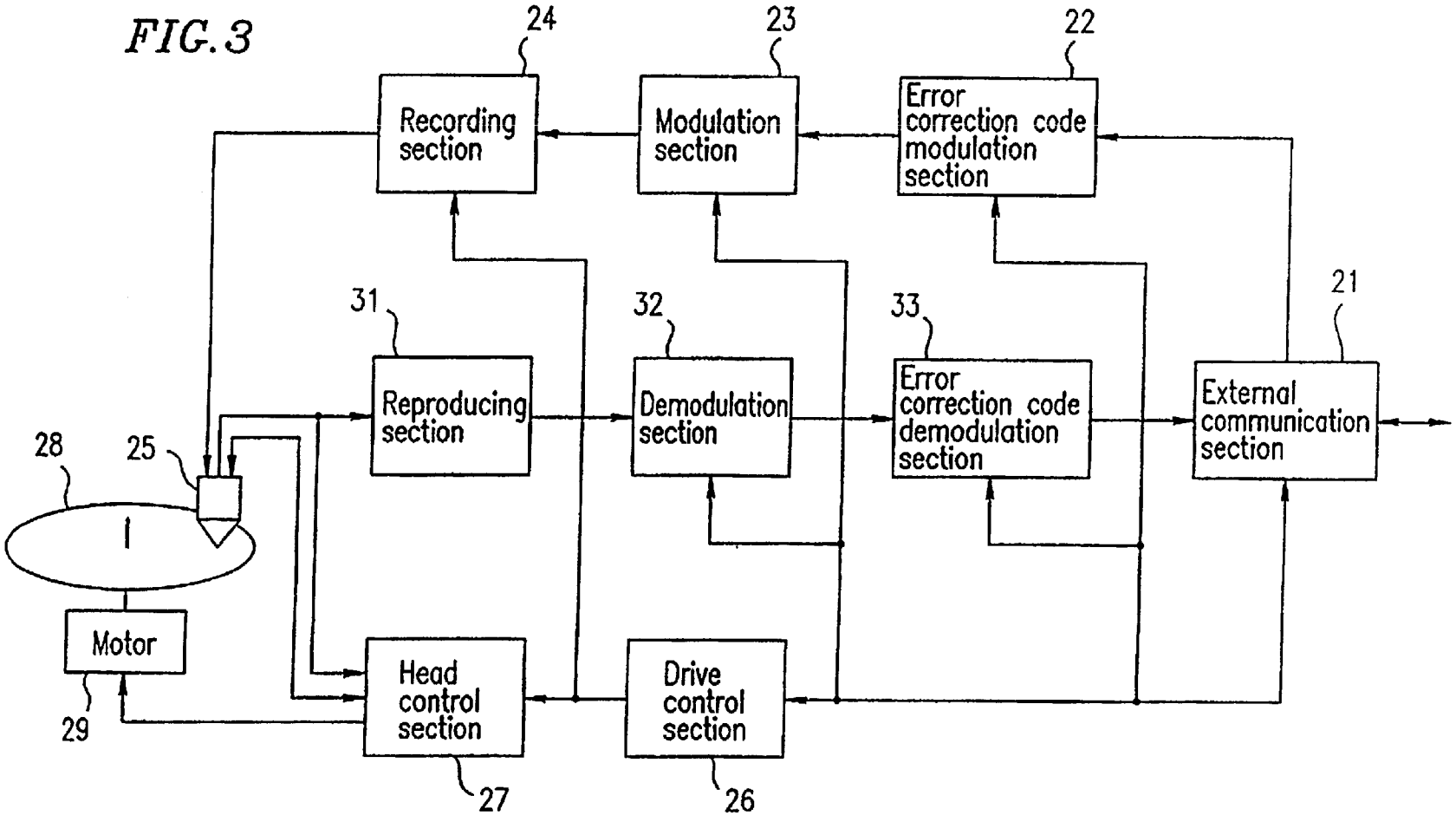
FIG. 3 is a block diagram showing a recording/reproducing apparatus to which the code conversion apparatus shown in FIG. 1 is applied.

FIG. 3 shows a recording/reproducing apparatus to which the code conversion apparatus shown in FIG. 1 has been applied.

In FIG. 3, when data to be recorded is input to an external communication section 21, the external communication section 21 supplies the input data to an error correction code modulation section 22. The error correction code modulation section 22 once stores the input data, divides the data into a plurality of sectors, adds an error correction code to each sector data and then outputs each sector data with the error correction code added to a modulation section 23. The modulation section 23 includes the code conversion apparatus shown in FIG. 1. Thus, the modulation section 23 scrambles and modulates the input data and error correction code on a sector basis, produces an output main data word, adds a sync code and the like to the main data word and then outputs the main data word to a recording section 24. The recording section 24 converts the one sector of main data, the sync code and the like into serial data, produces a recording signal corresponding to the serial data and then outputs the recording signal to an optical head 25. The optical head 25 transforms the recording signal into an optical signal (or laser light) and then irradiates the laser light onto an optical disk 28.

A drive control section 26 controls the overall operation of the recording/reproducing apparatus. Specifically, the drive control section 26 instructs a head control section 27 to record one sector of main data, a sync code and the like onto the optical disk 28 in synchronization with the processing performed by the modulation section 23 and the recording section 24. In response to the instruction, the head control section 27 controls a motor 29 driving the rotating optical disk 28 and controls the actuator of the optical head 25 such that the optical head 25 traces the desired tracks on the optical disk 28.

As a result, one sector of main data, a sync code and the like are recorded onto one sector (or a recording region) on the optical disk 28.

As mentioned above, if the DSV diverges during the scrambling and the modulation of one sector of main data, the code conversion apparatus shown in FIG. 1 outputs a conversion failure signal. Then, after the code conversion apparatus has received the same sector of main data again, the code conversion apparatus newly selects another pseudo-random number sequence and then repeats the scrambling and the modulation of the same sector of main data.

In this recording/reproducing apparatus, the conversion failure signal is input to the error correction code modulation section 22 and a drive control section 26. In response to the conversion failure signal, the error correction code modulation section 22 supplies again the same sector of main data to the modulation section 23, while the drive control section 26 instructs the head control section 27 to re-start recording the sector of main data, the sync code and the like. In response to this instruction, the head control section 27 controls not only the motor 29 driving the rotating optical disk 28 but also the movement of the optical head 25, thereby suspending the write of the sector of main data, the sync code and the like onto the recording region on the optical disk 28. Thereafter, when the same sector of main data, the sync code and the like are input again, the head control section 27 writes the same sector of main data and the like onto the same recording region on the optical disk 28 again. Thus, in this recording/reproducing apparatus, the write onto the same recording region on the optical disk 28 is repeatedly performed until a sector of main data causing the convergence of the DSV, the sync code thereof, and the like, are finally input and written onto the same recording region on the optical disk 28.

Furthermore, in this recording/reproducing apparatus, when the reproduction of data is externally instructed through the external communication section 21, the drive control section 26 notifies the head control section 27 of the instruction. In response to the notification, the head control section 27 controls not only the motor 29 driving the rotating optical disk 28 but also the movement of the optical head 25. Consequently, the optical head 25 reads out an optical signal representing the main data word, the sync code and the like from the optical disk 28 on a sector basis, and then outputs a reproduced signal corresponding to the optical signal to a reproducing section 31. The reproducing section 31 samples and digitizes the reproduced signal, thereby producing serial data. Then, the reproducing section 31 further converts the serial data into parallel data and outputs one sector of main data, the sync code thereof and the like to a demodulation section 32. The demodulation section 32 demodulates the main data word while detecting the sync code thereof. Then, the demodulation section 32 outputs the demodulated main data word to an error correction code demodulation section 33. The error correction code demodulation section 33 detects and corrects the error of the main data word based on the error correction code thereof and then outputs the corrected main data word to the outside via the external communication section 21.

EXAMPLE 2

Figure 4:
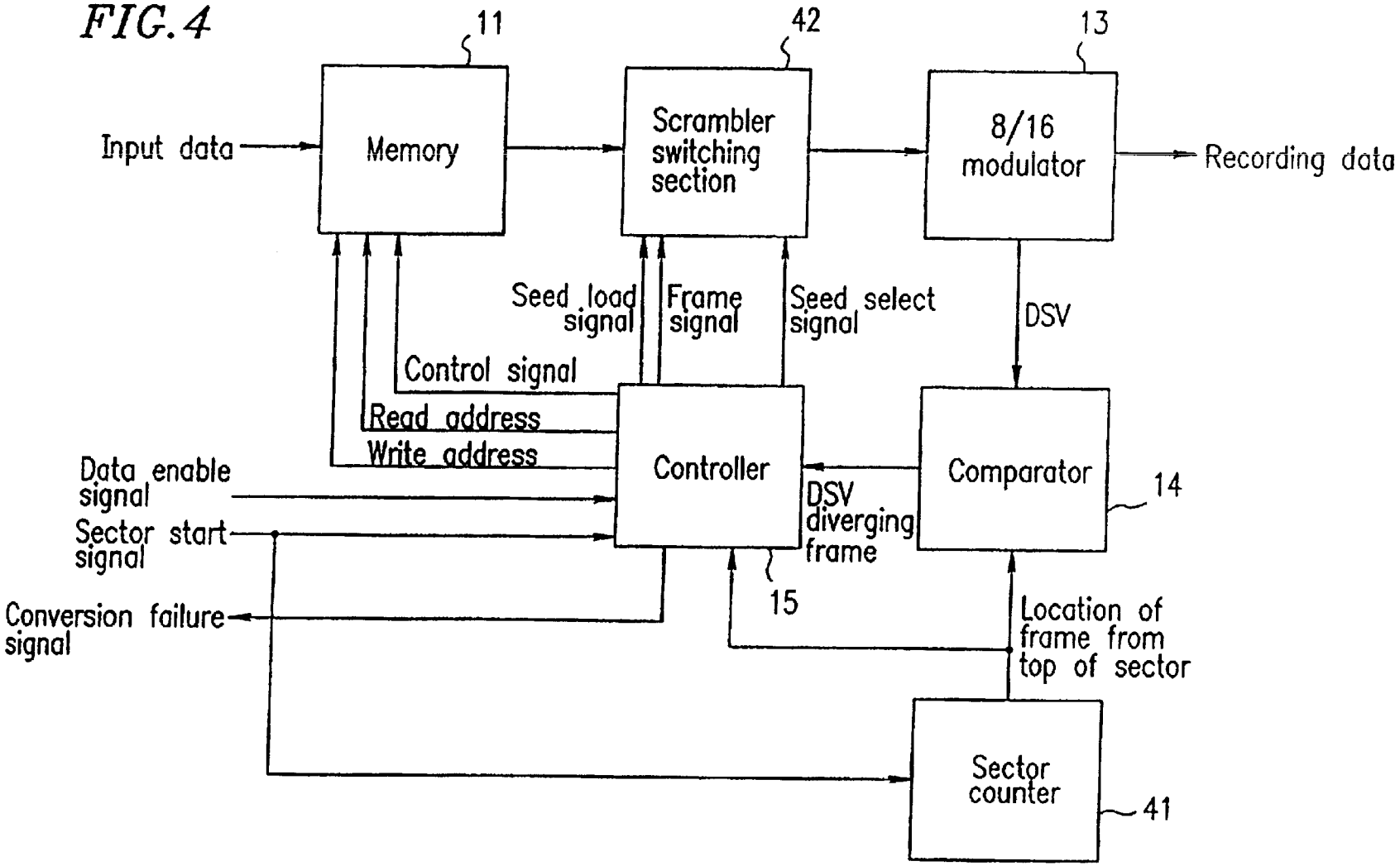
FIG. 4 is a block diagram showing a code conversion apparatus in a second example of the present invention.

FIG. 4 shows a code conversion apparatus in a second example of the present invention. The code conversion apparatus of the second example is different from the code conversion apparatus of the first example in that a sector counter 41 is additionally provided for the apparatus shown in FIG. 1 and that a scrambler switching section 42 is formed in place of the scrambler 12. The scrambler switching section 42 re-starts scrambling and modulation on a sector basis when the DSV has diverged, and selectively changes the scrambling method only in a frame which has caused the divergence of the DSV.

When a sector start signal is asserted or when the read of one sector of main data from the memory 11 is started, the sector counter 41 sequentially counts the respective frames of the sector in accordance with a bit clock or a word clock, detects the location of the frame currently processed by the scrambler switching section 42 and the 8/16 modulator 13 or the location of the current frame from the top of the sector, and then notifies the comparator 14 and the controller 15 of the frame location.

Figure 5:
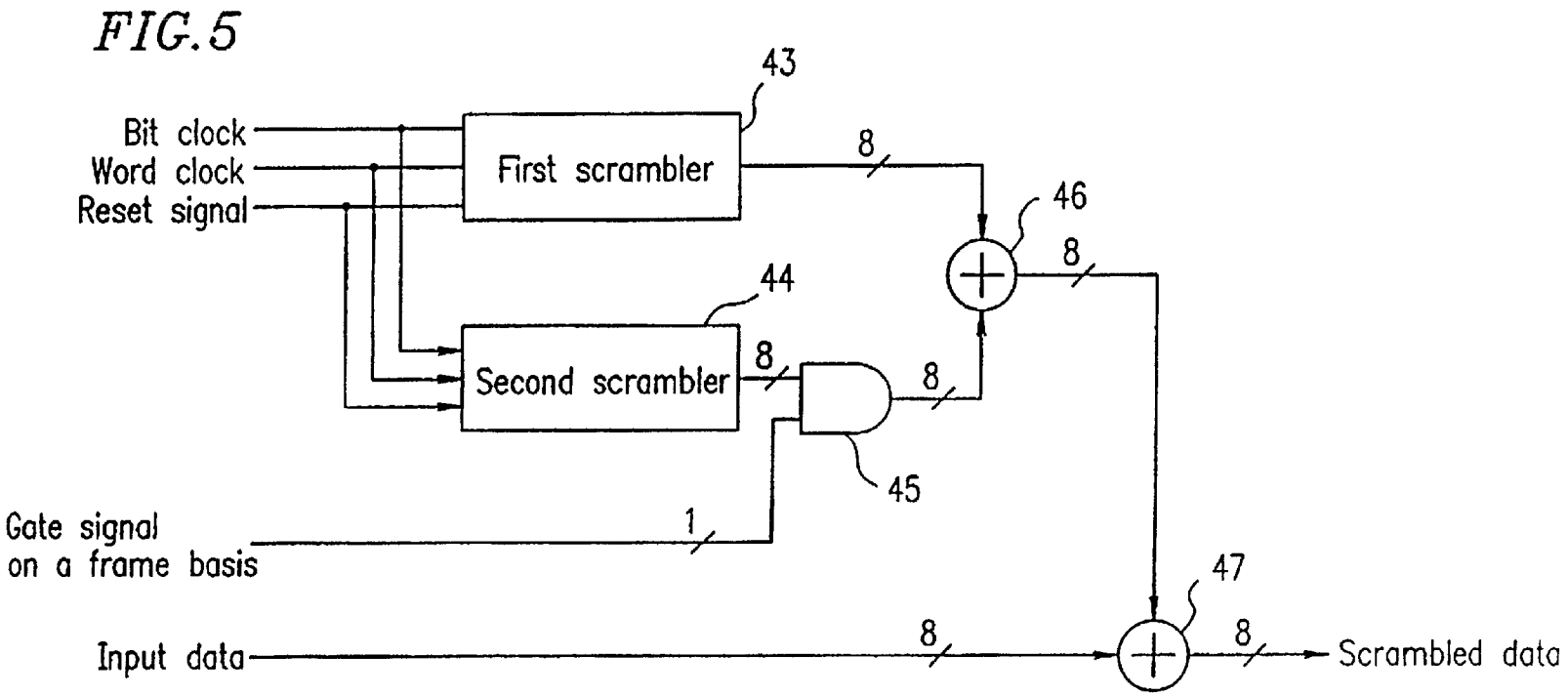
FIG. 5 is a block diagram showing in detail a scrambler switching section of the code conversion apparatus shown in FIG. 4.
Figure 6:
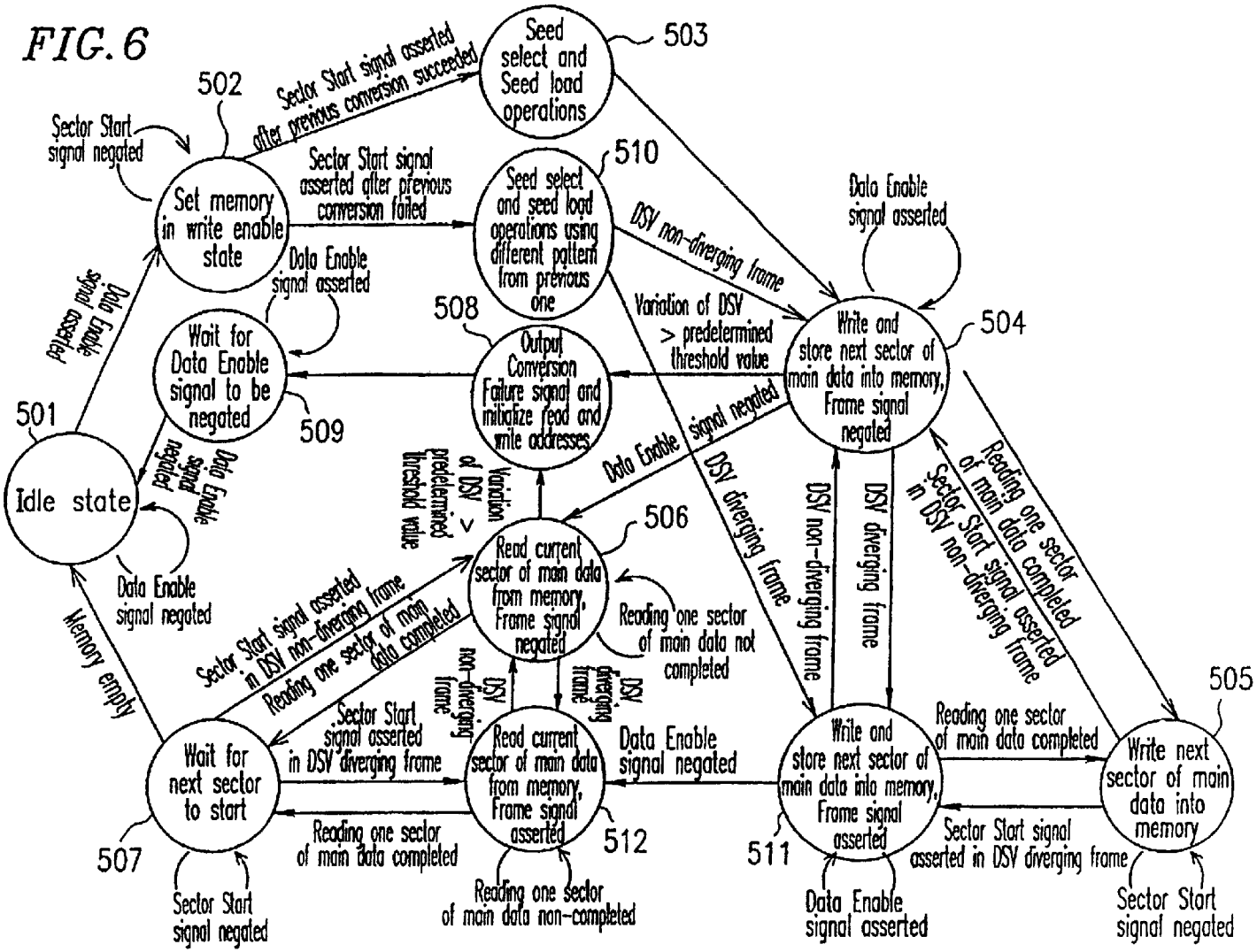
FIG. 6 is a state transition diagram illustrating the operation procedure of the code conversion apparatus shown in FIG. 4.

As shown in FIG. 5, the scrambler switching section 42 includes: a first scrambler 43; a second scrambler 44; an AND circuit 45; and a pair of exclusive-OR elements 46 and 47. The first scrambler 43 is configured in substantially the same way as the scrambler 101 shown in FIG. 19 and includes a seed ROM 111, a shift register 112, an exclusive-OR element 113 and a flip-flop 114 (it is noted that a part of the exclusive-OR elements 115 shown in FIG. 19 correspond to the exclusive-OR element 46). Thus, the first scrambler 43 also outputs the data (or the random numbers) generated by the M sequence represented by the generating polynomial (1). Similarly, the second scrambler 44 is also configured in substantially the same ways as the scrambler 101 shown in FIG. 19 and includes a seed ROM 111, a shift register 112, an exclusive-OR element 113 and a flip-flop 114 (it is noted that the other part of the exclusive-OR elements 115 correspond to the exclusive-OR element 47). Thus, the second scrambler 44 also outputs the data (or the random numbers) generated by the M sequence represented by the generating polynomial (2). However, it should be noted that in the second scrambler 44, the capacities of the seed ROM 111, the shift register 112, and the flip-flop 114 are required to be larger than those of the first scrambler 43.

In general, since a frame signal from the controller 15 is negated and a 0-bit signal is input to the AND circuit 45, the data of the second scrambler 44 is not output to the exclusive-OR element 46. Thus, the exclusive-OR element 47 determines and outputs an exclusive-OR of the output data of the first scrambler 43 and the 8-bit input main data word. In such a case, the scrambler switching section 42 functions in the same way as the scrambler 101 shown in FIG. 19.

However, if the frame signal from the controller 15 is asserted during an arbitrary frame period of one sector, a 1-bit signal is input to the AND circuit 45. In such a case, the exclusive-OR of the output data of the first scrambler 43 and the output data of the second scrambler 44 is obtained by the exclusive-OR element 46, and the exclusive-OR operation is further performed by the exclusive-OR element 47 on the exclusive-OR obtained by the exclusive-OR element 46 and the 8-bit input main data word. Thus, the scrambling method differs from the other frames in only this frame.

The operation of a code conversion apparatus having such a configuration will be described with reference to a state transition diagram shown in FFIG. 6.

First, the controller 15 is in an idle state (State 501). When a data enable signal is asserted, the memory 11 is set in a write enable state (State 502), thereby starting storage of one sector of main data. When a sector start signal is asserted, the controller 15 starts reading one sector of main data from the memory 11 and supplies the read main data word to the scrambler switching section 42. The controller 15 also supplies a seed select signal and a seed load signal to the scrambler switching section 42 (State 503). The first and the second scramblers 43 and 44 of the scrambler switching section 42 set the respective initial bit patterns of the pseudo-random number sequences in response to the seed select signal and the seed load signal, thereby outputting the respective date. In this case, since the frame signal has been negated, the respective main data words are sequentially scrambled based on the output data of the first scrambler 43. The scrambled main data words are sequentially output to the 8/16 modulator 13. The 8/16 modulator 13 sequentially modulates the scrambled main data words by means of the PPM, thereby producing a main data word (16 bits) from each of the scrambled main data words (8 bits). Then, the 8/16 modulator 13 further modulates the 16-bit main data word by means of the PWM, thereby producing a 16-bit output main data word from the 16-bit main data word and outputting the 16-bit output main data word. Furthermore, the 8/16 modulator 13 obtains a DSV for the respective main data words by means of an accumulation and then outputs the DSV to the comparator 14. Then, the comparator 14 determines whether or not the variation of the DSV has exceeded a predetermined threshold value and then outputs the determination result to the controller 15.

While one sector of main data is read out from the memory 11 and the scrambling and the modulation of the main data word are performed, a next sector of main data is written into and stored in the memory 11 and the frame signal is still negated (State 504).

After the read of the one sector of main data from the memory 11 has been completed, the read is suspended and only the write of the next sector of main data into the memory 11 is continued (State 505). And when the write is completed and another sector start signal is asserted, the processing returns to State 504 and another sector of main data is read out, scrambled and modulated.

If a next sector of main data is no longer input in State 504, only the read of the current sector of main data from the memory 11 is continued (State 506). When the read of the current sector is completed, the controller 15 enters a wait state for waiting for a next sector of main data (State 507). And when the memory 11 becomes empty, the processing returns to the idle state (State 501).

In this manner, the respective sectors of main data words are sequentially stored in the memory 11 and thus these sectors of main data words are sequentially read out from the memory 11. Then, these sectors of main data words are sequentially scrambled, modulated and output.

On the other hand, if the comparator 14 has determined that the variation of the DSV has exceeded a threshold value (or the DSV has diverged so that the low frequency components of the main data word output from the 8/16 modulator 13 have increased) during the scrambling and the modulation of one sector of main data (States 504 and 506), the controller 15 identifies and stores the frame which has caused the divergence of the DSV in accordance with the notification supplied from the sector counter 41, initializes the write address and the read address for the memory 11 and outputs a conversion failure signal (State 508). The conversion failure signal is output to the 8/16 modulator 13 and to the drive control section 26 and the error correction code modulation section 22 of the recording/reproducing apparatus shown in FIG. 3.

The conversion failure signal is input to the 8/16 modulator 13 as a reset signal, thereby initializing the 8/16 modulator 13. Also, in response to the conversion failure signal, the recording/reproducing apparatus stops recording the sector and re-starts recording the sector. Furthermore, in response to the conversion failure signal, the main data word at the beginning of the sector is newly supplied to a circuit on the first stage (or the error correction code modulation section 22 of the recording/reproducing apparatus).

Then, the controller 15 waits for the write into the memory 11 to be disabled (State 509). When the write is disabled, the processing returns to State 502 via State 501. When the recording of the one sector of main data in which the DSV has diverged is re-started, the controller 15 re-starts reading the sector of main data, provides the main data word to the first and the second scramblers 43 and 44 of the scrambler switching section 42 and outputs the seed select signal and the seed load signal to the first and the second scramblers 43 and 44 (State 510). In this State 510, the controller 15 outputs a seed select signal instructing the initial bit pattern of a different pseudo-random number sequence (from the pseudo-random number sequence which has caused the divergence of the DSV) to the first and the second scramblers 43 and 44 such that the one sector of main data is scrambled by the different pseudo-random number sequence.

If the previous frame which has caused the divergence of the DSV is a top frame, the controller 15 asserts the frame signal only during the period of this top frame. In response to the frame signal, the scrambler switching section 42 scrambles the frame in accordance with the respective output data of the first and the second scramblers 43 and 44 and then outputs the scrambled frame to the 8/16 modulator 13 (State 511). Subsequently, the controller 15 negates the frame signal from the next frame on, while the scrambler switching section 42 scrambles the main data words in accordance with only the output data of the first scrambler 43 and then sequentially outputs the scrambled main data words to the 8/16 modulator 13 (State 504).

On the other hand, if the previous frame which has caused the divergence of the DSV is not a top frame, the controller 15 keeps the frame signal negated, while the scrambler switching section 42 scrambles the main data words in accordance with only the output data of the first scrambler 43 and then sequentially outputs the scrambled main data words to the 8/16 modulator 13 (State 504). However, when the frame which has caused the divergence of the DSV is reached in the meantime, the controller 15 asserts the frame signal only during the period of the frame. In response to the frame signal, the scrambler switching section 42 scrambles the frame in accordance with the respective output data of the first and the second scramblers 43 and 44 and then outputs the scrambled frame to the 8/16 modulator 13 (State 511). Subsequently, the controller 15 negates the frame signal from the next frame on, while the scrambler switching section 42 scrambles the main data words in accordance with only the output data of the first scrambler 43 (State 504).

Furthermore, if the frame which has caused the divergence of the DSV is reached in a state where a next sector of main data is no longer input (State 504) and only the read of the current sector of main data from the memory 11 is continued (State 506), then the controller 15 asserts the frame signal only during the period of the frame. In response to the frame signal, the scrambler switching section 42 scrambles the frame in accordance with the respective output data of the first and the second scramblers 43 and 44 (State 512). Subsequently, the controller 15 negates the frame signal from the next frame on, while the scrambler switching section 42 scrambles the main data words in accordance with only the output data of the first scrambler 43 (State 506).

Thereafter, so long as the DSV diverges during the scrambling and the modulation of one sector of main data (States 504, 506), the same sector of main data is repeatedly scrambled and modulated via the respective States 508, 509, 501, 502 and 510.

In this second example, if the DSV has diverged, not only the pseudo-random number sequence of a sector but also the pseudo-random number sequence of the frame which has caused the divergence of the DSV are changed, thereby repeatedly performing the scrambling and the modulation of the same sector of main data. Alternatively, the scrambling and the modulation of the same sector of main data may be repeated by changing only the pseudo-random number sequence of the frame which has caused the divergence of the DSV.

In addition, assuming the number of words during a predetermined first period L to be G, the number of all the modulation patterns for the main data words to be M, and the number of the modulation patterns which are more likely to cause the divergence of the DSV to be N, it is preferable that newly selected second pseudo-random number sequence is applied to such a number of words including no bit patterns which are more likely to cause the divergence of the DSV as to be larger than $G\times(M-N)/M$.

Moreover, if one sector period of main data words is called a "second period" H, at least the same number of different types of second pseudo-random number sequences as $H/L=J$ are preferably set beforehand.

Furthermore, instead of determining whether or not the variation of the DSV has exceeded a threshold value, it may be determined whether or not the absolute value of the DSV has exceeded a predetermined threshold value.

EXAMPLE 3

Figure 7:
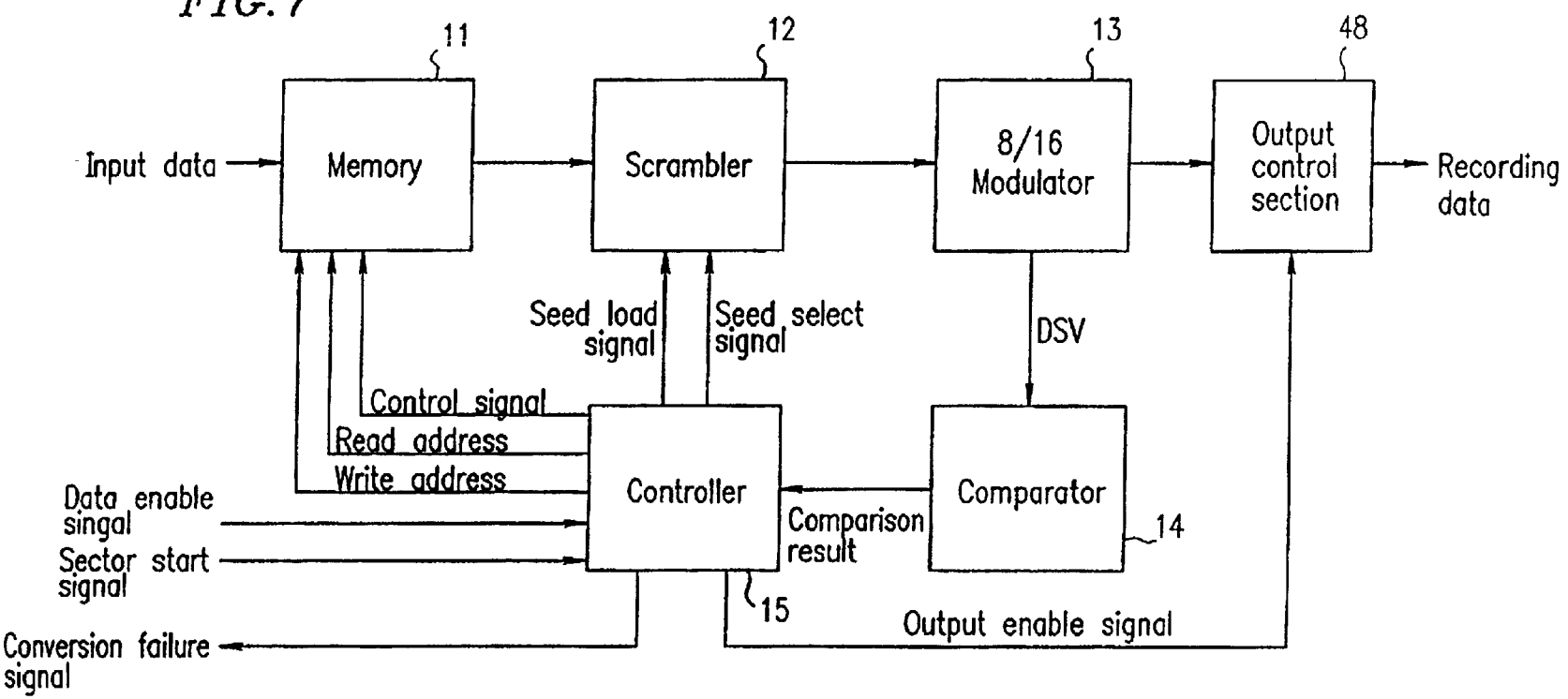
FIG. 7 is a block diagram showing a code conversion apparatus in a third example of the present invention.

FIG. 7 shows a code conversion apparatus in a third example of the present invention. The code conversion apparatus of the third example is different from the code conversion apparatus of the first example in that an output control section 48 for interrupting or passing the output of the 8/16 modulator 13 is additionally provided for the apparatus shown in FIG. 1.

In this example, first, the controller 15 negates an output enable signal to the output control section 48, thereby interrupting the output of the 8/16 modulator 13 by the output control section 48. When the data enable signal is asserted in this state, the controller 15 sets the memory 11 in a write enable state, thereby inputting and storing one sector of main data into the memory 11. Subsequently, when a sector start signal is asserted, the controller 15 starts to read one sector of main data from the memory 11 and supplies the read main data word to the scrambler 12. The controller 15 also supplies a seed select signal and a seed load signal to the scrambler 12. The scrambler 12 selects any of the initial bit patterns of the respective pseudo-random number sequences in response to the seed select signal, generates a series of random numbers beginning with the selected initial bit pattern in response to the seed load signal, scrambles the respective main data words in accordance with the series of random numbers and sequentially outputs the scrambled main data words to the 8/16 modulator 13. Then, the 8/16 modulator 13 modulates the scrambled main data words by means of the PPM, thereby producing 16-bit main data words from the 8-bit main data words. Thereafter, the 8/16 modulator 13 further modulates the 16-bit main data word by means of the PWM, thereby producing 16-bit output main data words from the 16-bit main data words and outputting the 16-bit output main data words.

However, in this state, the 16-bit output main data words are interrupted by the output control section 48 and are not transmitted to the recording section 24 of the recording/reporducing apparatus.

Furthermore, the 8/16 modulator 13 obtains a DSV for the respective main data words by means of an accumulation and then outputs the DSV to the comparator 14. Then, the comparator 14 determines whether or not the variation of the DSV has exceeded a predetermined threshold value and then outputs the determination result to the controller 15.

If it is determined that the variation of the DSV is equal to or smaller than a predetermined threshold value, the controller 15 asserts the output enable signal to the output control section 48, thereby enabling the output of the 8/16 modulator 13 to pass the output control section 48. Furthermore, the controller 15 reads the same sector of main data as the previous sector from the memory 11, supplies the main data word to the scrambler 12 and outputs the same seed select signal as the previous one and the same seed load signal as the previous one to the scrambler 12. As a result, the same scrambled main data word as the previous one is supplied from the scrambler 12 to the 8/16 modulator 13, and the same output main data word as the previous one is output from the 8/16 modulator 13.

The output main data word passes through the output control section 48 so as to be supplied to the recording section 24 of the recording/reproducing apparatus.

On the other hand, if it is determined that the variation of the DSV has exceeded the predetermined threshold value, the controller 15 keeps the output enable signal to the output control section 48 negated, thereby interrupting the output of the 8/16 modulator 13 by the output control section 48. In such a state, the controller 15 reads the same sector of main data as the previous sector from the memory 11, supplies the main data word to the scrambler 12 and changes the seed select signal, thereby outputting the newly selected seed select signal, together with the seed load signal, to the scrambler 12. The scrambler 12 newly selects another initial bit pattern of a pseudo-random number sequence in response to the seed select signal, generates a series of random numbers, scrambles the respective main data words in accordance with the series of random numbers and sequentially outputs the scrambled main data words to the 8/16 modulator 13. Then, the 8/16 modulator 13 modulates the scrambled main data words, thereby outputting the 16-bit output main data words. The 16-bit output main data words are interrupted by the output control section 48 and are not transmitted to the recording section 24 of the recording/reproducing apparatus.

Furthermore, the 8/16 modulator 13 obtains a DSV for the respective main data words by means of an accumulation and then outputs the DSV to the comparator 14. Then, the comparator 14 determines whether or not the variation of the DSV has exceeded a predetermined threshold value and then outputs the determination result to the controller 15.

Once the variation of the DSV has exceeded the predetermined threshold value, while the output enable signal to the output control section 48 is kept negated, the same sector of main data as the previous sector is read again from the memory 11, a different pseudo-random number sequence is newly selected, and the respective main data words are scrambled and modulated, thereby obtaining a DSV. Thereafter, the pseudo-random number sequences are repeatedly changed and the scrambling and the modulation are repeatedly performed until the DSV becomes equal to or smaller than the threshold value.

When the variation of the DSV becomes equal to or smaller than the threshold value as a result of the repetitive processing, the output enable signal to the output control section 48 is asserted, the same sector of main data as the previous sector is read again from the memory 11, the main data word is re-scrambled by the same pseudo-random number sequence as that used for the previous processing, the main data word is modulated and the output main data word is output through the output control section 48.

Thus, so long as the variation of the DSV is over the threshold value, the output of the 8/16 modulator 13 is interrupted by the output control section 48 and the pseudo-random number sequences are repeatedly changed and the scrambling and the modulation are repeatedly performed. On the other hand, when the variation of the DSV becomes equal to or smaller than a predetermined threshold value, the interruption of the output of the 8/16 modulator 13 by the output control section 48 ceases, the pseudo-random number sequence is set to be the same as the pseudo-random number sequence used during the previous processing, and then scrambling and modulation are performed, thereby again producing the output main data word in which the variation of the DSV has become equal to or smaller than the threshold value and outputting the output main data word via the output control section 48. In this case, since only the output main data word in which the variation of the DSV has become equal to or smaller than the threshold value is output on a sector basis, the recording/reproducing apparatus has only to write the output main data word once onto the recording region on the optical disk 28 and need not repeatedly write the data word onto the same recording region on the optical disk 28.

In this third example, it is also preferable that newly selected second pseudo-random number sequence is applied to such a number of words including no bit patterns which are more likely to cause the divergence of the DSV as to be larger than $G\times(M-N)/M$.

Moreover, at least the same number of different types of second pseudo-random number sequences as $H/L=J$ are preferably set beforehand.

Furthermore, instead of determining whether or not the variation of the DSV has exceeded a threshold value, it may be determined whether or not the absolute value of the DSV has exceeded a predetermined threshold value.

EXAMPLE 4

Next, an optical disk implemented as an exemplary recording medium of the present invention will be described as a fourth example of the present invention will reference to FIGS. 8 to 11.

Figure 8:
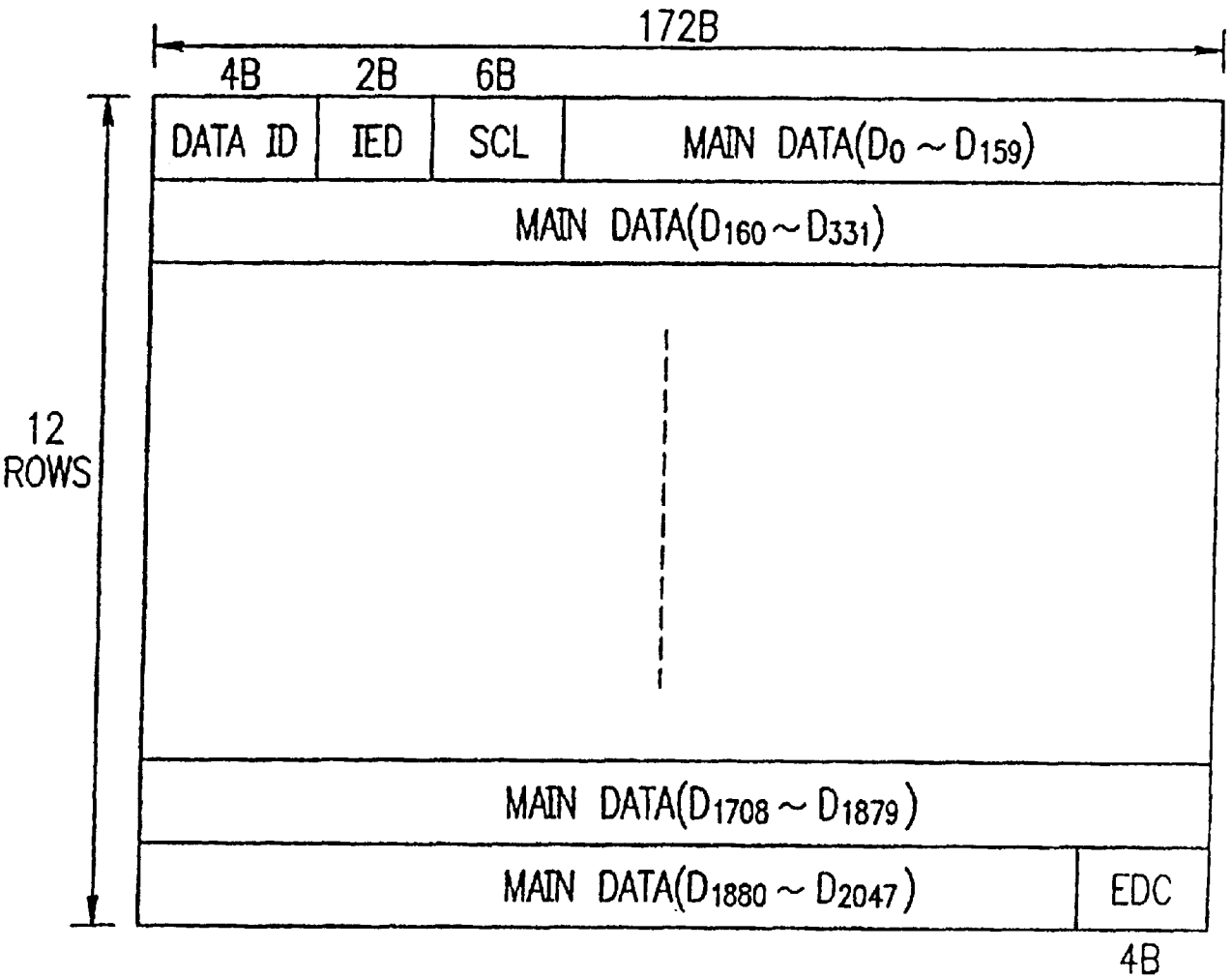
FIG. 8 shows an exemplary format for a data unit of the optical disk implemented as an exemplary recording medium in a fourth example of the present invention.
Figure 9:
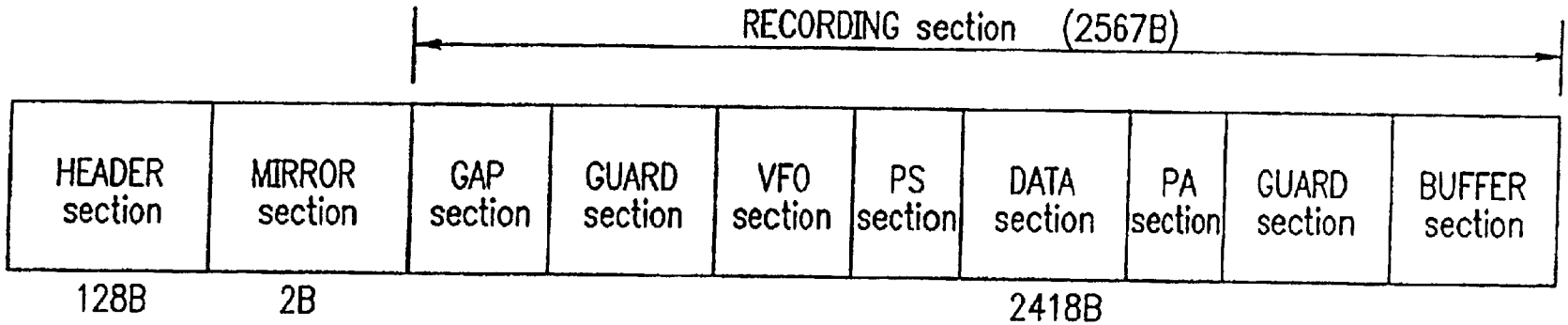
FIG. 9 shows an exemplary sector format of the optical disk in the fourth example of the present invention.
Figure 10:
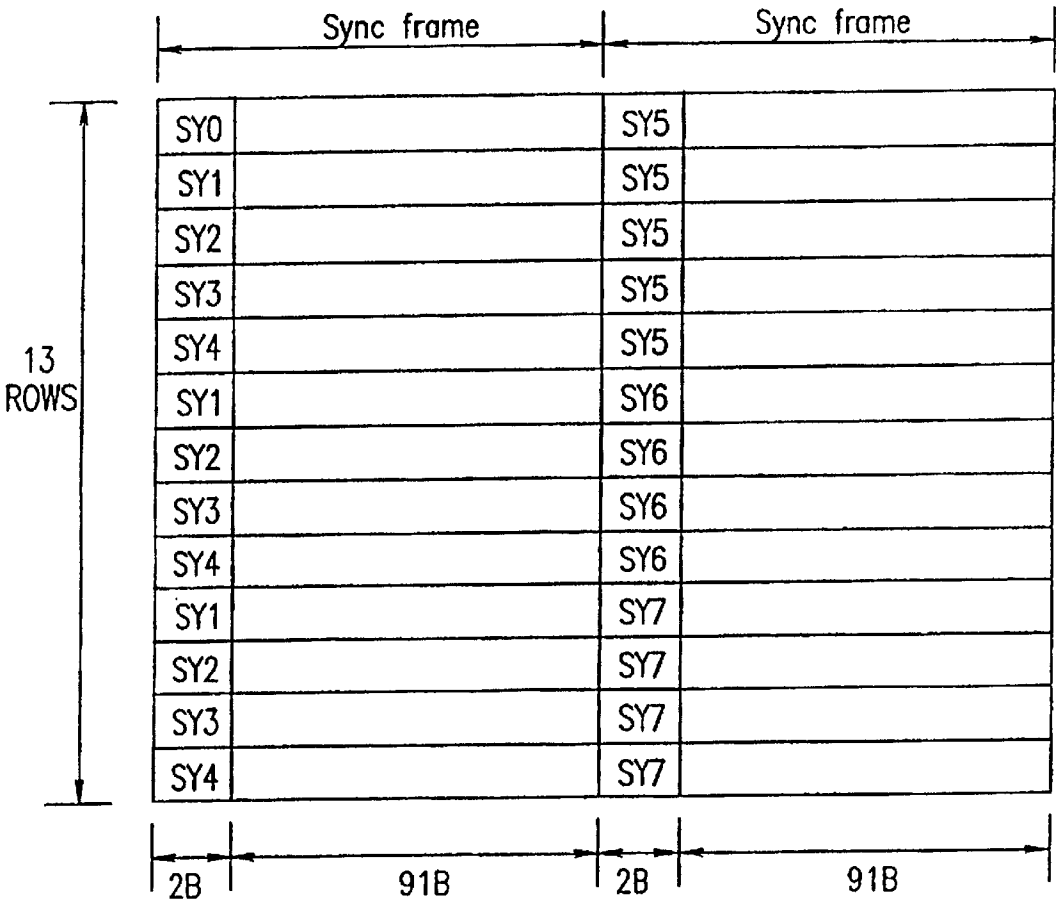
FIG. 10 shows an exemplary sync frame format of the optical disk in the fourth example of the present invention.
Figure 11:
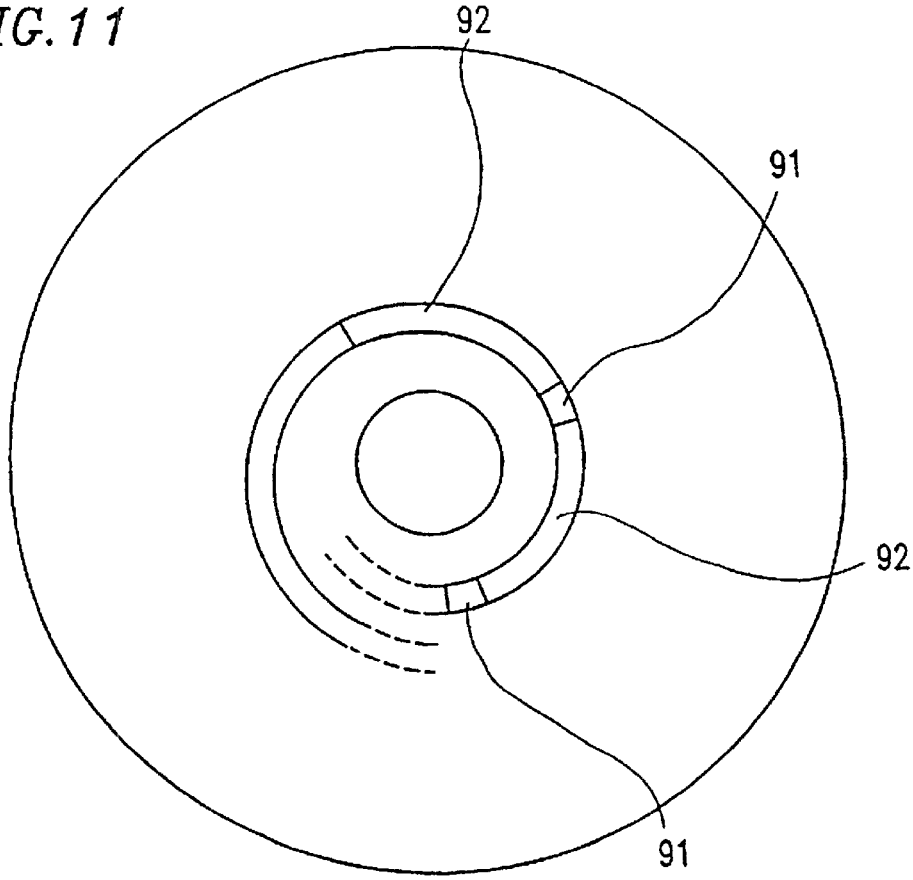
FIG. 11 schematically shows the optical disk in the fourth example of the present invention.

FIG. 8 shows an exemplary format of a data unit of the optical disk in the fourth example of the present invention. FIG. 9 shows an exemplary sector format of the optical disk. FIG. 10 shows an exemplary sync frame format of the optical disk. The data unit shown in FIG. 8 is included in the sync frame format shown in FIG. 10, and the sync frame format shown in FIG. 10 is included in the sector format shown in FIG. 9. FIG. 11 schematically shows an optical disk including sectors having the sector format shown in FIG. 9 thereon.

On an optical disk, various types of main data such as video data, audio data and computer data are divided into and recorded/reproduced onto/from the respective sectors.

As shown in FIG. 11, a single sector on the optical disk includes a HEADER section, a MIRROR section 91 and a RECORDING section 92. A plurality of such sectors are alternately formed on the optical disk.

As shown in FIG. 9, a single sector generally includes a HEADER section, a MIRROR section and a RECORDING section, and is composed of 2697 bytes in total. The HEADER section and the MIRROR section are defined beforehand on the optical disk. It is the RECORDING section onto/from which data is actually recorded/reproduced. The RECORDING section includes a GAP section, a GUARD section, a VFO section, a PS section, a DATA section, a PA section and a BUFFER section and occupies 2567 bytes in total. Among these sections, the DATA section occupies 2418 bytes, corresponds to the sync frame format shown in FIG. 10 and is composed of 26 sync frames (93 bytes per frame).

As shown in FIG. 8, a data unit is composed of 2064 bytes (172 bytes×12) in total and consists of a DATA ID section (4 bytes), an IED section (2 bytes), an SCL section (6 bytes), a MAIN DATA section (2048 bytes) and an EDC section (4 bytes). In the DATA ID section, data representing a tracking type (i.e., either a groove track or a land track), data representing either a read area or a read out area, a sector address or the like is recorded. In the IED section, a code used for detecting an error in the DATA IN section is recorded. In the SCL section, scramble data is recorded. In the EDC section, a code used for detecting an error in the remaining sections (2060 bytes) other than the EDC section is recorded.

The scramble data recorded in the SCL section and the sector address recorded in the DATA ID section indicate one of the initial bit patterns of a plurality of predetermined pseudo-random number sequences. The scramble processing is performed on main data by performing a logical operation (e.g., an exclusive-OR operation) on a series of random numbers beginning with the initial bit pattern and the main data to be recorded onto the optical disk.

The data unit shown in FIG. 8 can be obtained by recording the scrambled main data onto the MAIN DATA section and adding the scramble data and the like thereto. When an error correction code is added to the data unit, then the total byte number becomes 2366 bytes. After these bytes are digitally modulated, a sync code represented by a synchronizing signal (2 bytes) is inserted into these bytes on a 91-byte basis, thereby forming the 26 sync frames shown in FIG. 10. Each of the synchronizing signals SY0, SY1, . . . SY7 is a combination of "0" bits and "1" bits, and has a unique pattern.

As a result, the total byte number becomes 2418 bytes corresponding to the DATA section included in the sector format shown in FIG. 9.

In this example, the pseudo-random number sequence is selected based on not only the scramble data but also a sector address. The reason is as follows. If the sector address is neglected, then a plurality of signals having high interrelation which have been scrambled by the same pseudo-random number sequence may be recorded onto adjacent tracks on the optical disk 28. In such a case, the tracking performance or the like becomes disadvantageously unstable. Thus, in this example, sector addresses are taken into consideration to ensure that mutually different pseudo-random number sequences are selected for adjacent tracks.

All of the six bits of the scramble data recorded in the SCL section are ordinarily set to be "0", for example. However, if the low frequency components of the signal to be recorded have increased abnormally (i.e., if the DSV has diverged), an arbitrary number of bits of the six bits are set to be bits other than "0". If all of the six bits of the scramble data are set to be "0", the scrambling is not performed. On the other hand, if an arbitrary number of bits of the six bits of the scramble data are set to be bits other than "0", the scrambling is performed.

It is noted that data associated with the times that a rewrite operation has been performed may be set as the scramble data when the data is rewritten. Alternatively, data obtained based on the random numbers or data obtained by combining these types of data may be also be set as the scramble data.

EXAMPLE 5

Figure 12:
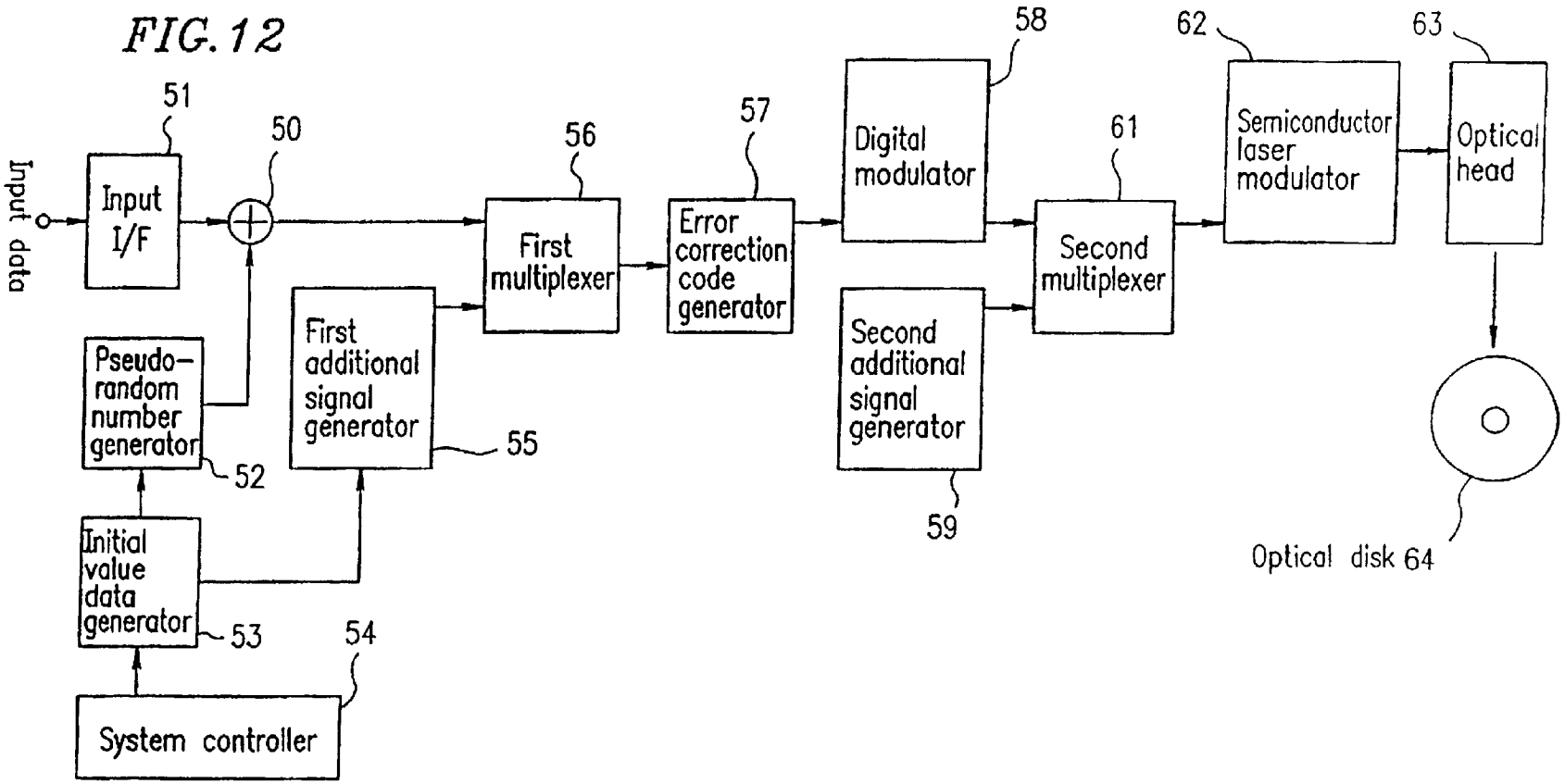
FIG. 12 is a block diagram showing a code recording apparatus in a fifth example of the present invention.

FIG. 12 shows an exemplary code recording apparatus as a fifth example of the present invention. The code recording apparatus records main data onto the optical disk shown in FIG. 11.

The main data such as digitized audio data, video data and computer data is input through an input interface (I/F) 51. The input main data is supplied to a logical operation circuit 50. Not only the main data but also the random numbers supplied from a pseudo-random number generator 52 are input to the logical operation circuit 50. The logical operation circuit 50 performs a logical operation (e.g., an exclusive-OR operation) on these random numbers and the main data, thereby performing the scrambling processing on the main data.

Figure 13:
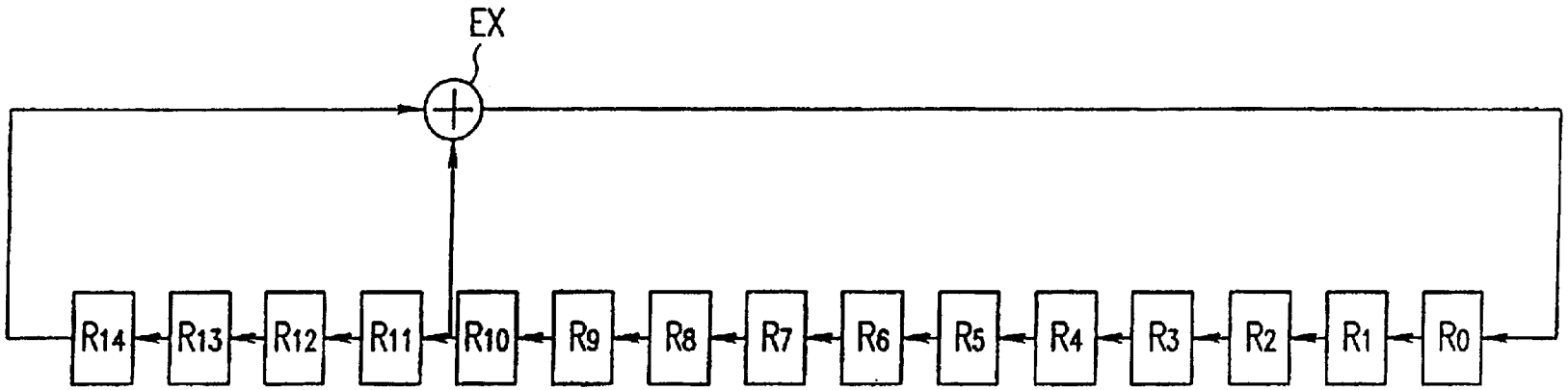
FIG. 13 is a block diagram schematically showing a pseudo-random number generator of the code recording apparatus shown in FIG. 12.

The pseudo-random number generator 52 generates pseudo-random number sequences in accordance with a primitive polynomial. For example, the fifteenth-order polynomial $X^{15}+X^4+1$ (the above-described generating polynomial (1)) or the thirty-first-order polynomial $X^{31}+X^3+1$ in the maximum length sequence is used as the primitive polynomial. For example, in the case of generating pseudo-random numbers based on the fifteenth-order polynomial $X^{15}+X^4+1$, the pseudo-random number generator 52 includes fifteen registers RE and a single exclusive-OR element EX as shown in FIG. 13. The initial bit patterns R14, R13, . . . R0 are set for the respective registers RE, the bits in these registers are sequentially shifted as indicated by the arrows and the bit values of these registers RE are sequentially changed, thereby generating a series of random numbers beginning with the initial bit pattern.

Thus, the initial bit patterns must be provided for the pseudo-random number generator 52. The initial bit patterns of the plurality of pseudo-random number sequences are stored in an initial value data generator 53. Every time one sector of main data is input, the initial value data generator 53 is instructed by a system controller 54 to select any of the initial bit patterns of the respective pseudo-random number sequences and provide the selected initial bit pattern for the pseudo-random number generator 52.

Conventionally, a data table on which 16 types of values (or bit strings) and 16 types of initial bit patterns (or initial values) of the pseudo-random number sequences such as those shown in FIG. 14 are written is stored beforehand in the initial value data generator 53, and an address representing a particular sector (recording region) on an optical disk is supplied from the system controller 54 to the initial value data generator 53. In response to the address, the initial value data generator 53 extracts a particular set of 4 bits from the address of the sector, selects an initial bit pattern corresponding to the 4-bit value from the data table and then supplies the initial bit pattern to the pseudo-random number generator 52.

However, whenever data is recorded onto the same sector (recording region) on the optical disk, the initial bit pattern of the same pseudo-random number sequence is selected. In such a case, if the same main data is repeatedly written onto the same sector, the characteristics of the recording medium become adversely non-uniform on the sector so that the S/N ratio of a reproduced signal is decreased.

Thus, in this fifth example of the present invention, the initial bit pattern of a pseudo-random number sequence is selected in view of not only the sector address but also other data. In this case, such other data includes data representing how many times the same sector has been rewritten (hereinafter, such data will be referred to as "rewrite repetition times data"). In this example, as shown in FIG. 15, a data table on which 16 types of initial bit patterns (or initial values) of the 16 pseudo-random number sequences corresponding to the 16 types of values (or bit strings) are set for each of the sixteen types of rewrite repetition times data, instead of the data table shown in FIG. 14, is stored in the initial value data generator 53. Arbitrary rewrite repetition times data is selected from the data table shown in FIG. 15 and the initial bit pattern of the pseudo-random number sequence corresponding to the sector address may be selected with reference to the initial bit patterns on the column of the selected rewrite repetition times data.

Alternatively, by making a random number generator generate random numbers in place of the rewrite repetition times data, any of a plurality of data tables may be selected in accordance with the random numbers. Furthermore, if rewrite repetition times data or a rewrite time stamp is supplied to the random number generator as an initial value generated by the pseudo-random number generator, the random numbers may be combined with the rewrite repetition times data or the rewrite time stamp.

The rewrite repetition times data or the rewrite time stamp is determined by the system controller 54 and then supplied to the initial value data generator 53.

The main data which has been scrambled in this manner is input as the MAIN DATA section shown in FIG. 8 to a first multiplexer 56. On the other hand, a first additional signal generator 55 receives not only the initial bit pattern of a pseudo-random number sequence as the scramble data from the initial value data generator 53 but also a sector address, a code for detecting an error and the like from the system controller 54, and supplies these data as the DATA ID section, the IED section, the SCL section and the EDC section shown in FIG. 8 to the first multiplexer 56. The first multiplexer 56 receives and arranges the respective sections and forms and outputs the data unit shown in FIG. 8. The data unit is input to an error correction code generator 57. An error correction code is obtained by the error correction code generator 57 and then added to the data unit.

A digital modulator (e.g., an 8/16 modulator) 58 digitally modulates the input data unit and error correction code and then outputs these data to a second multiplexer 61. On the other hand, a second additional signal generator 59 receives necessary data from the system controller 54, produces the synchronizing signals (sync codes) for the VFO section, the PS section, the PA section and the DATA section shown in FIG. 9 and then outputs these signals to the second multiplexer 61. The second multiplexer 61 receives and arranges the respective sections and forms and outputs one sector of data shown in FIG. 9.

The sector of data is input to and modulated by a semiconductor laser modulator 62. The modulated output of the semiconductor laser modulator 62 is applied to an optical head 63, thereby controlling the laser light emitted from a semiconductor laser device provided inside the optical head 63. The laser light is irradiated onto the optical disk 64 so that one sector of data is recorded onto the optical disk 64.

EXAMPLE 6

Figure 16:
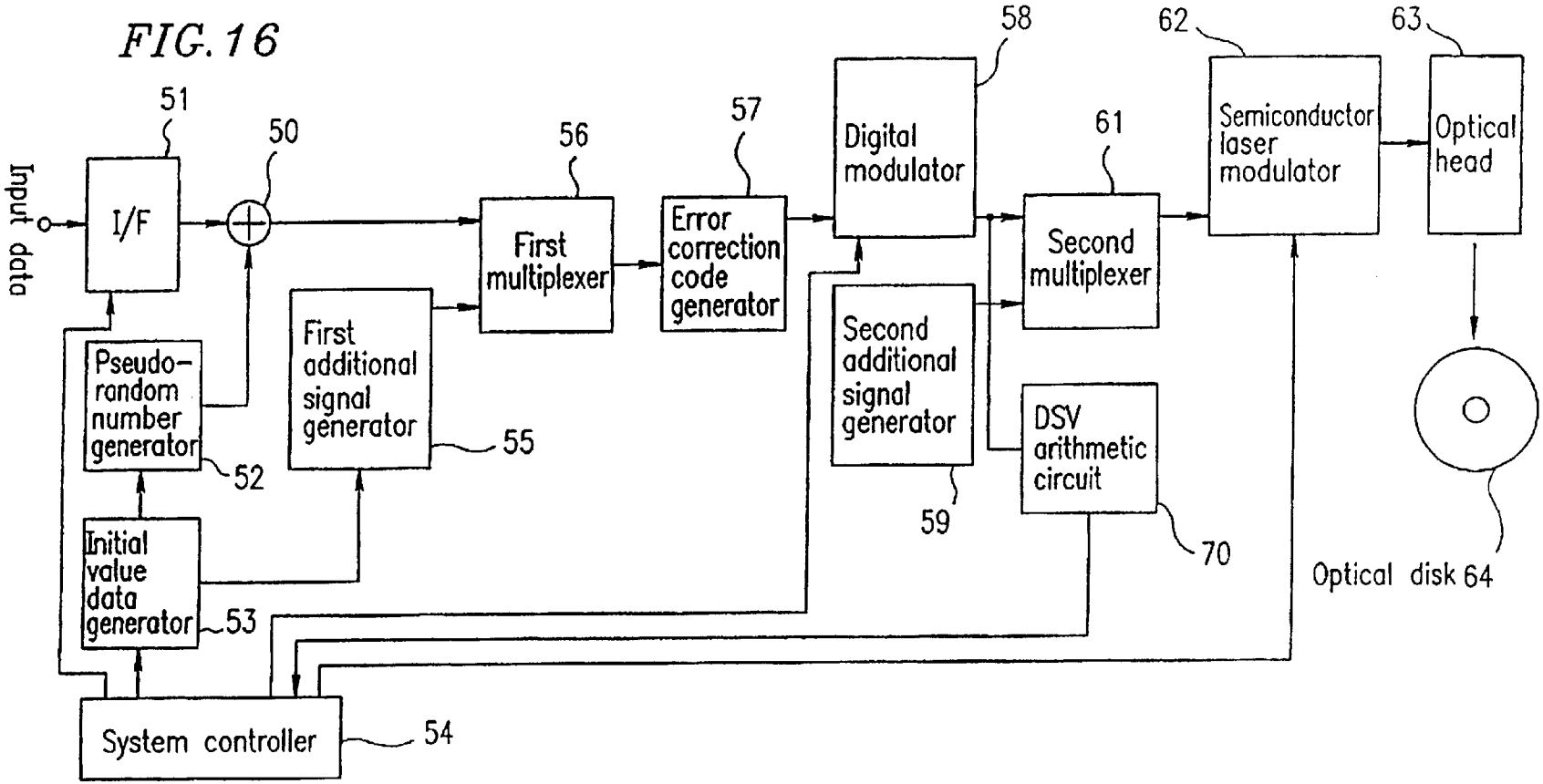
FIG. 16 is a block diagram showing a code recording apparatus in a sixth example of the present invention.

FIG. 16 shows another exemplary code recording apparatus as a sixth example of the present invention. The code recording apparatus of the sixth example is different from the code reproducing apparatus of the fifth example in that a DSV arithmetic circuit 70 is additionally provided for the apparatus shown in FIG. 12.

In FIG. 16, the components having the same functions as those of the counterparts shown in FIG. 12 are identified by the same reference numerals.

In the apparatus shown in FIG. 16, main data is input through an input interface (I/F) 51. The logical operation circuit 50 scrambles the input main data by using the random numbers supplied from the pseudo-random number generator 52, and then outputs the scrambled main data as the MAIN DATA section shown in FIG. 8 to the first multiplexer 56. The first additional signal generator 55 supplies the DATA ID section, the IED section, the SCL section and the EDC section shown in FIG. 8 to the first multiplexer 56. The first multiplexer 56 receives and arranges the respective sections and forms and outputs a data unit shown in FIG. 8. The data unit is input to an error correction code generator 57. An error correction code is obtained by the error correction code generator 57 and then added to the data unit. The digital modulator (e.g., an 8/16 modulator) 58 digitally modulates an input data unit and error correction code and then outputs these data.

The operation of the apparatus shown in FIG. 16 is the same as that of the apparatus shown in FIG. 12 up to this point in time. Thus, the initial bit pattern of a pseudo-random number sequence used for scrambling is set based on not only a sector address but also rewrite repetition times data, a rewrite time stamp or random numbers.

Next, a DSV arithmetic circuit 70 calculates a DSV for the output data of the digital modulator 58 and then supplies the DSV to the system controller 54. The system controller 54 determines whether or not the absolute value of the DSV is larger than a predetermined threshold value, for example.

On the other hand, the second additional signal generator 59 supplies the synchronizing signals (sync codes) for the VFO section, the PS section, the PA section and the DATA section shown in FIG. 9 to the second multiplexer 61. The second multiplexer 61 receives and arranges the respective sections and forms and outputs one sector of data as shown in FIG. 9.

The sector of data is input to and modulated by the semiconductor laser modulator 62. The modulated output of the semiconductor laser modulator 62 is applied to the optical head 63, thereby controlling the laser light emitted from the semiconductor laser device provided inside the optical head 63. As a result, one sector of data is recorded onto the optical disk 64.

In this example, if the absolute value of the DSV is larger than the threshold value, then recording unprocessed output data of the digital modulator 58 onto the optical disk 64 may cause an inconvenience during the reproduction of the data from the optical disk 64. Thus, the system controller 54 instructs the semiconductor laser modulator 62 to re-start recording the same sector.

In addition, the system controller 54 also instructs the initial value data generator 53 to newly select another initial bit pattern of a pseudo-random number sequence and further instructs the pseudo-random number generator 52 to re-start scrambling. Moreover, the system controller 54 instructs the input I/F 51, the error correction code generator 57, the digital modulator 58, the rotation driver (not shown) of the optical disk 64 or the actuator (not shown) of the optical head 63 to re-start processing.

As a result, the same sector of main data is re-scrambled and modulated and the DSV of the output data of the digital modulator 58 is calculated again. Thereafter, scrambling, modulation and recording of the same sector of main data are repeatedly performed until the DSV becomes equal to or lower than the threshold value. After the data associated with the DSV equal to or lower than the threshold value has been recorded onto the optical disk, the processing proceeds to the next sector.

It is noted that the same sector of main data may be repeatedly supplied from a circuit on the proceeding stage so as to be repeatedly processed. Alternatively, the same sector of main data may be once stored in the input I/F 51 and repeatedly supplied from the input I/F 51 so as to be repeatedly processed.

Furthermore, instead of repeatedly recording the same sector of main data, the output data of the digital modulator 58 may be stored once in a buffer. In such a case, if the DSV has exceeded the threshold value, the data stored in the buffer may be supplied to the semiconductor laser modulator 62. On the other hand, if the DSV is equal to or smaller than the threshold value, the data stored in the buffer may be discarded.

Moreover, though a semiconductor laser device is exemplified in the embodiments of the code reproducing apparatus shown in FIGS. 12 and 16, the present invention is also applicable to a gas laser device.

EXAMPLE 7

Figure 17:
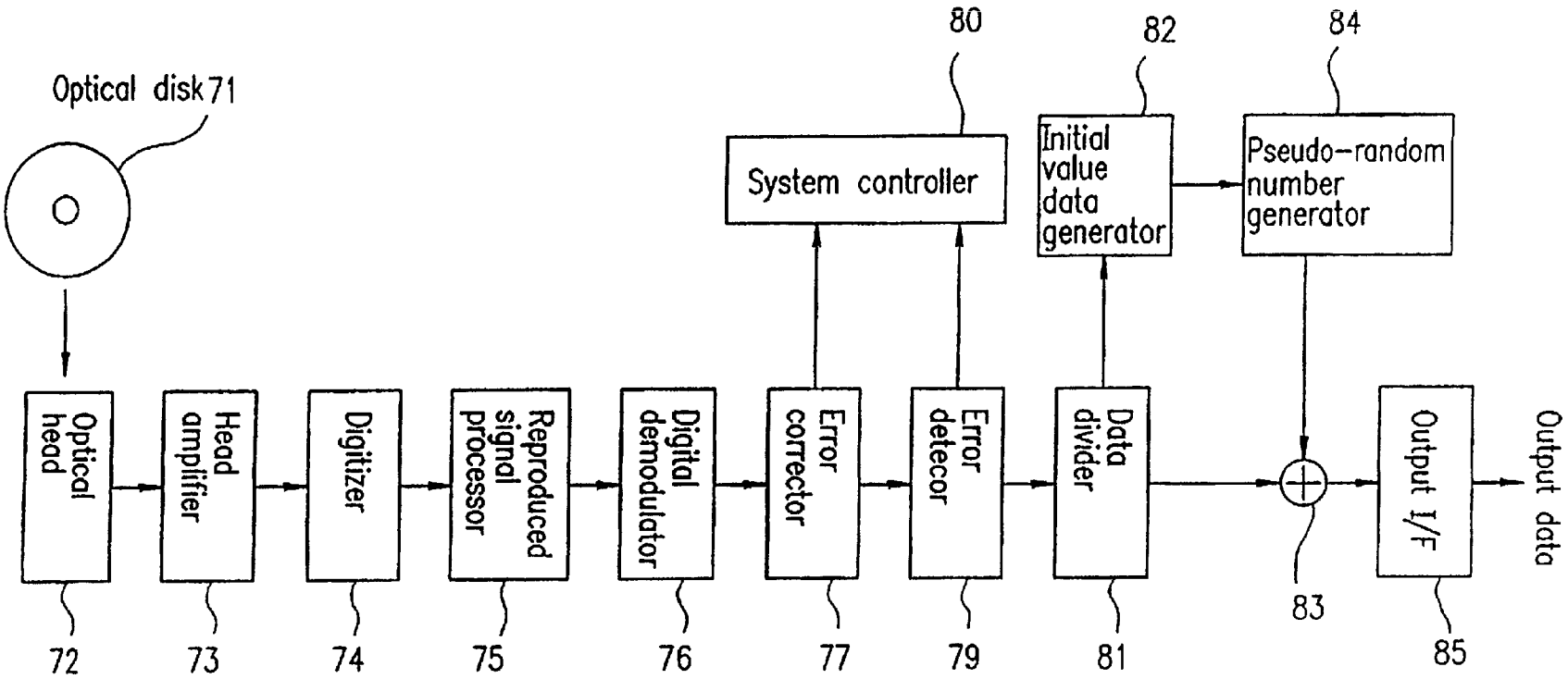
FIG. 17 is a block diagram showing a code reproducing apparatus in a seventh example of the present invention.

FIG. 17 shows an exemplary code reproducing apparatus as a seventh example of the present invention. The code reproducing apparatus reproduces the main data recorded onto the optical disk shown in FIG. 11 by the code recording apparatus shown in FIG. 12 or FIG. 16.

In FIG. 17, when laser light is irradiated onto an optical disk 71, the light is modulated and reflected by the optical disk 71 so as to be incident as an optical signal having variable intensity onto light-receiving elements of an optical head 72. The light-receiving elements of the optical head 72 photoelectrically converts the optical signal having variable intensity and then outputs an electrical signal representing the variation of the intensity of the optical signal to a head amplifier 73. The head amplifier 73 amplifies the weak electrical signal and then outputs the signal to a digitizer 74. The digitizer 74 converts the output of the head amplifier 73 into a digital signal representing "0" and "1" and then outputs the digital signal to a reproduced signal processor 75. The reproduced signal processor 75 removes the synchronizing signals and the like in the HEADER section, the MIRROR section, the GAP section, the GUARD section, the VFO section, the PS section, the PA section, the BUFFER section and the DATA section from the digital signal (shown in FIG. 9) and then outputs the resulting data to a digital demodulator 76. The digital demodulator 76 digitally demodulates the input data and then outputs the demodulated data to an error corrector 77.

The error corrector 77 corrects the error of the data in accordance with the error correction code included in the data, and then outputs the corrected data to an error detector 79. On the other hand, if the error of the data cannot be corrected, then the data is not output to the error detector 79 and the error corrector 77 notifies the system controller 80 of the failure in the error correction. In response to the notification, a system controller 80 instructs a rotation driver (not shown) of the optical disk 71 or an actuator (not shown) of the optical head 72 to re-start processing. As a result, the same sector data is read again from the optical disk 71, input again to the error corrector 77 and then corrected by the error corrector 77.

The error detector 79 detects the error of the corrected data (shown in FIG. 8) in accordance with the IED section and the EDC section included in the data. Though the possibility of such an error in error correction is low, the error of the error corrector 77 can be detected by the error detector 79 with certainty. If the error has been detected, then the error detector 79 notifies the system controller 80 of the error detection. In response to the notification, the system controller 80 re-starts processing as mentioned above. As a result, the same data is read again from the same sector on the optical disk 71, input again to the error detector 79, in which the error of the error correction is detected.

If the error detector 79 has not detected any error from the data, then the error detector 79 outputs the data to a data divider 81. The data divider 81 divides the data into the DATA ID section, the IED section, the SCL section, the MAIN DATA section and the EDC section, outputs the SCL section to an initial value data generator 82 and the main data included in the MAIN DATA section to a logical operation circuit 83.

The same data tables as those stored in the initial value data generator 53 shown in FIG. 12 are stored in the initial value data generator 82. When the SCL section is input from the data divider 81 to the initial value data generator 82, the initial value data generator 82 selects any of the initial bit patterns of the pseudo-random number sequences in accordance with the scramble data included in the SCL section and then outputs the selected initial bit pattern of the pseudo-random number sequence to a pseudo-random number generator 84, in the same manner as the initial value data generator 53 shown in FIG. 12. When the initial bit pattern of the pseudo-random number sequence is input to the pseudo-random number generator 84, the pseudo-random number generator 84 generates the same random numbers as those generated by the pseudo-random number generator 52 when the main data included in the MAIN DATA section is scrambled by the code recording apparatus shown in FIG. 12, and then outputs these random number to the logical operation circuit 83.

The logical operation circuit 83 performs a logical operation on the main data supplied from the data divider 81 and the random numbers supplied from the pseudo-random number generator 84, thereby de-scrambling the main data and outputting the de-scrambled main data as reproduced data to the outside through an output I/F 85.

In this way, the data which has been scrambled during recording is de-scrambled during reproduction, so as to be restored into original data.

As is apparent from the foregoing description, in the code conversion method and apparatus of the present invention, if the variation of a calculated value representing a difference between the number of "0" bits and the number of "1" bits in the output main data word (i.e., the variation of a DSV) has exceeded a threshold value, another scramble data is newly selected and the input main data word is scrambled again. The scramble data is repeatedly changed and the scrambling is repeatedly performed until the DSV becomes equal to or smaller than the threshold value. As a result, the increase of the DSV can be prevented and the low frequency components of the output main data word can be reduced.

Thus, when such an output main data word is recorded onto a recording medium and a signal is reproduced from the recording medium, it is possible to reduce the low frequency components of the reproduced signal and to prevent a reproduction error satisfactorily.

In addition, since the DSV can be included within a tolerance range with respect to any input main data word having any pattern, the reproduction error can be satisfactorily prevented.

Furthermore, in the code recording medium and the code recording/reproducing apparatus of the present invention, since scramble data and scrambled main data are recorded on a sector basis, the scramble data and the scrambled main data can be read from an arbitrary sector and the scrambled main data can be restored into original data in accordance with the scramble data. Thus, any arbitrary scrambling method may be selected with respect to particular main data and an abnormal variation of the low frequency components of a reproduced signal can be effectively suppressed. As a result, the reproduced signal can be digitized with high precision and the possibility of the generation of a reproduction error can be considerably reduced. Moreover, the scramble data is changed in accordance with how many times the data has been rewritten on the same sector on an optical disk. Thus, even if the same main data is repeatedly written onto the same sector, the characteristics of the recording medium can be kept uniform on the sector, the decrease of the S/N ratio of a reproduced signal can be suppressed and the reliability of repeatedly performed recording/reproducing operations can be improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A code conversion method comprising the steps of:

scrambling an input main data unit based on any of plural types of pseudo-random number sequences;

modulating the scrambled main data unit based on any of plural types of modulation data;

producing an output main data unit from the modulated main data unit;

obtaining a calculated value representing a difference between a number of 0 bits and a number of 1 bits included in the output main data unit; and selecting any of the modulation data dependent upon the calculated value, wherein the code conversion method further includes the step of:

determining whether or not a variation of the calculated value has exceeded a predetermined threshold value;

newly selecting another pseudo-random number sequence used for the step of scrambling if it is determined that the variation of the calculated value has exceeded the predetermined threshold value; and re-scrambling the input main data unit based on the newly selected pseudo-random number sequence.

2. A code conversion method according to claim 1, wherein the step of modulating the scrambled main data unit is performed by a first modulation having M types of modulation data, and wherein the step of producing the output main data unit is performed by a second modulation, N types of modulation data out of the M types of modulation data causing an increase of the calculated value.

3. A code conversion method according to claim 2, wherein, in the step of modulating, the first modulation is a pit position modulation having M types of modulation data, and wherein, in the step of producing, the second modulation is a pulse width modulation, and wherein N types of modulation data out of the M types of modulation data causing an increase of the calculated value.

4. A code conversion method according to claim 2, wherein, in the step of determining, if the variation of the calculated value becomes equal to or larger than the threshold value K during a first period L, an output main data unit having a bit pattern which has caused the increase of the calculated value is included in a plurality of main data units to be output during the first period L, and wherein if the pseudo-random number sequence applied to the main data unit which has caused the increase of the calculated value is called a first pseudo-random number sequence, the first pseudo-random number sequence is changed into any of a plurality of predetermined second pseudo-random number sequences, and wherein the plurality of second pseudo-random number sequences are pseudo-random number sequences making it possible to obtain a plurality of main data units not having the bit pattern as the main data units to be produced by the step of re-scrambling and to be output during the first period L at a ratio equal to or larger than (M−N)/M.

5. A code conversion method according to claim 4, wherein if a period during which a series of output main data units are produced by the step of scrambling using the first pseudo-random number sequence is called a second period H, the number of the plurality of second pseudo-random number sequences is at least equal to H/L=J.

6. A code conversion method according to claim 1, wherein, in the step of determining, if the variation of the calculated value has exceeded the threshold value, a part of the main data units which have been previously input before the point in time and have a predetermined length is re-scrambled after another pseudo-random number sequence is newly selected for the part.

7. A code conversion method according to claim 1, further comprising the steps of:

obtaining a calculated value of an output main data unit corresponding to the input main data unit having a predetermined length;

newly selecting another pseudo-random number sequence and re-scrambling the input main data unit if the variation of the calculated value has exceeded the threshold value; and obtaining a pseudo-random number sequence causing the variation of the calculated value to be equal to or smaller than the threshold value.

8. A code conversion method comprising the steps of:

scrambling an input main data unit based on any of plural types of pseudo-random number sequences;

modulating the scrambled main data unit based on any of plural types of modulation data;

producing an output main data unit from the modulated main data unit;

obtaining a calculated value representing a difference between a number of 0 bits and a number of 1 bits included in the output main data unit; and selecting any of the modulation data dependent upon the calculated value, wherein the code conversion method further includes the steps of:

determinant whether or not an absolute value of the calculated value has exceeded a predetermined threshold value;

newly selecting another pseudo-random number sequence used for the step of scrambling if it is determined that the absolute value of the calculated value has exceeded the predetermined threshold value; and re-scrambling the input main data unit based on the newly selected pseudo-random number sequence.

9. A code conversion method according to claim 8, wherein the step of modulating the scrambled main data unit is performed by a first modulation having M types of modulation data, and wherein the step of producing the output main data unit is performed by a second modulation, and wherein N types of modulation data out of the M types of modulation data causing an increase of the calculated value.

10. A code conversion method according to claim 9, wherein, in the step of modulating, the first modulation is a pit position modulation having M types of modulation data, and wherein, in the step of producing, the second modulation is a pulse width modulation, and wherein N types of modulation data out of the M types of modulation data causing the increase of the calculated value.

11. A code conversion method according to claim 9, wherein, in the step of determining, if the absolute value of the calculated value becomes equal to or larger than the threshold value K during a first period L, an output main data unit having a bit pattern which has caused the increase of the calculated value is included in a plurality of main data units to be output during the first period L, and wherein if the pseudo-random number sequence applied to the main data unit which has caused the increase of the calculated value is called a first pseudo-random number sequence, the first pseudo-random number sequence is changed into any of a plurality of predetermined second pseudo-random number sequences, and wherein the plurality of second pseudo-random number sequences are pseudo-random number sequences making it possible to obtain a plurality of main data units not having the bit pattern as the main data units to be produced by the step of re-scrambling and to be output during the first period L at a ratio equal to or larger than (M−N)/M.

12. A code conversion method according to claim 11, wherein if a period during which a series of output main data units are produced by the step of scrambling using the first pseudo-random number sequence is called a second period H, the number of the plurality of second pseudo-random number sequences is at least equal to H/L=J.

13. A code conversion method according to claim 8, wherein, when the absolute value of the calculated value exceeds the threshold value, a part of the main data units which have been previously input before the point in time and have a predetermined length is re-scrambled after another pseudo-random number sequence is newly selected for the part.

14. A code conversion method according to claim 8, further comprising the steps of:

obtaining a calculated value of an output main data unit corresponding to the input main data unit having a predetermined length;

newly selecting another pseudo-random number sequence and re-scrambling the input main data unit if the absolute value of the calculated value has exceeded the threshold value; and obtaining a pseudo-random number sequence causing the absolute value of the calculated value to be equal to or smaller than the threshold value.

15. A code conversion apparatus comprising:

storage means for storing an input main data unit;

scrambling means for scrambling the main data unit stored in the storage means based on any of plural types of pseudo-random number sequences; data and producing an output main data unit from the modulated main data unit;

arithmetic means for obatining a calculated value representing a difference between a number of 0 bits and a number of 1 bits included in the output main data unit which has been produced by the modulation means;

comparison means for determining whether or not the calculated value obtained by the arithmetic means is within a predetermined tolerance range; and control means for instructing the scrambling means to newly select another pseudo-random number sequence and to re-scramble the main data units stored in the storage means if the comparison means determines that the calculated value is out of the tolerance range.

16. A code conversion apparatus according to claim 15, further comprising recording means for recording output data of the modulation means, wherein the control means outputs a conversion failure signal if the comparison means has determined that the calculated value is out of the tolerance range, and wherein the recording means re-starts recording the output data of the modulation means, in response to the conversion failure signal.

17. A code conversion apparatus comprising:

storage means for storing an input main data unit;

scrambling means for scrambling the main data unit stored in the storage means based on any of plural types of pseudo-random number sequences;

detection means for detecting a location of the main data unit which has been read out from the storage means;

modulation means for modulating the scrambled main data unit based on any of plural types of modulation data and producing an output main data unit from the modulated main data unit;

arithmetic mean for obtaining a calculated value representing a difference between a number of 0 bits and a number of 1 bits included in the output main data unit;

comparison means for determining whether or not the calculated value obtained by the arithmetic means is within a predetermined tolerance range; and control means for instructing the scrambling means to newly select another pseudo-random number sequence and then to re-scramble a part of the main data units located prior to the location of the main data unit which has been detected by the detection means at a point in time when the comparison means has determined that the calculated value is out of the tolerance range.

18. A code conversion apparatus according to claim 17, further comprising recording means for recording the output main data unit, wherein the control means outputs a conversion failure signal if the comparison means has determined that the calculated value is out of the tolerance range, and wherein the recording means re-starts recording the output main data unit, in response to the conversion failure signal.

19. A code conversion apparatus comprising:

storage means for storing an input main data unit;

scrambling means for scrambling the main data unit stored in the storage means based on any of plural types of pseudo-random number sequences;

detection means for detecting a location of each frame of the main data unit stored in the storage means, every time each said frame is sequentially read out from the storage means;

modulation means for modulating the scrambled main data unit based on any of plural types of modulation data and producing an output main data unit from the modulated main data unit;

arithmetic means for obtaining a calculated value representing a difference between a number of 0 bits and a number of 1 bits included in the output main data unit;

comparison means for determining whether or not the calculated value obtained by the arithmetic means is within a predetermined tolerance range; and control means for instructing the scrambling means to newly select another pseudo-random number sequence and then to re-scramble a plurality of frames located prior to the frame, the location of which has been detected by the detection means, at a point in time when the comparison means has determined that the calculated value is out of the tolerance range.

20. A code conversion apparatus according to claim 19, further comprising recording means for recording the output data of the modulation means, wherein the control means outputs a conversion failure signal if the comparison means has determined that the calculated value is out of the tolerance range, and wherein the recording means re-starts recording the output data of the modulation means, in response to the conversion failure signal.

21. A code conversion apparatus comprising:

storage means for storing at least one sector of input main data units;

scrambling means for scrambling the at least one sector of main data units stored in the storage means based on any of plural types of pseudo-random number sequences;

modulation means for modulating the scrambled main data units based on any of plural types of modulation data and producing output main data units from the modulated main data units;

arithmetic means for obtaining a calculated value representing a difference between a number of 0 bits and a number of 1 bits included in each of the output main data units;

comprison means for determining whether or not the calculated value obtained by the arithmetic means is within a predetermined tolerance range; and control means for instructing the scrambling means to newly select another pseudo-random number sequence and then to re-scramble the at least one sector of main data units stored in the storage means if the comparison means has determined that the calculated value is out of the tolerance range.

22. A code conversion apparatus according to claim 21, further comprising recording means for recording the output main data units, wherein the control means outputs a conversion failure signal if the comparison means has determined that the calculated value is out of the tolerance range, and wherein the recording means re-starts recording the output main data units, in response to the conversion failure signal.

23. A code recording medium for recording/reproducing main data thereon/therefrom on a sector basis, wherein scramble data and scrambled main data are recorded in every sector, and wherein the scramble data is represented by any of initial values of predetermined pseudo-random number sequences for scrambling the main data, and wherein each of the pseudo-random number sequences is comprised of a plurality of random numbers beginning with an initial value of the pseudo-random number sequence, and wherein the main data has been scrambled by sequentially performing a logical operation on the pseudo-random number sequence representing the scramble data and the main data.

24. A code recording medium according to claim 23, wherein each of the pseudo-random number sequences is a maximum length sequence.

25. A code recording medium according to claim 23, wherein the scramble data indicates whether or not a sector of main data is scrambled.

26. A code recording medium according to claim 23, wherein the scramble data is set based on the random numbers.

27. A code recording medium according to claim 23, wherein the scramble data is set in accordance with how many times main data has been rewritten on the same sector.

28. A code recording apparatus for scrambling and recording main data on a sector basis on a recording medium, comprising:

scramble data generation means for generating scramble data represented by any of a plurality of predetermined pseudo-random number sequences;

pseudo-random number sequence generation means for generating the pseudo-random number sequences in accordance with the scramble data, each of the pseudo-random number sequences being represented by the scramble data;

scrambling means for scrambling the main data by sequentially performing a logical operation on the generated pseudo-random number sequence and a sector of main data;

modulation means for modulating the scrambled main data; and recording means for recording the modulated main data together with the scramble data onto a sector on the recording medium.

29. A code recording apparatus for scrambling and recording main data on a sector basis on a recording medium, comprising:

scramble data generation means for generating scramble data represented by any of a plurality of predetermined pseudo-random number sequences;

pseudo-random number sequence generation means for generating the pseudo-random number sequences in accordance with the scramble data, each of the pseudo-random number sequences being represented by the scramble data;

scrambling means for scrambling the main data by sequentially performing a logical operation on the generated pseudo-random number sequence and a sector of main data;

modulation means for modulating the scrambled main data;

recording means for recording the modulated main data together with the scramble data onto a sector on the recording medium;

arithmetic means for obtaining a calculated value representing a difference between a number of 0 bits and a number of 1 bits included in the modulated main data; and a determination means for determining the calculated value.

30. A code recording apparatus according to claim 28, wherein the pseudo-random number sequence generation means generates the pseudo-random number sequences in accordance with not only the scramble data but also sector identification data for identifying each sector of the recording medium.

31. A code recording apparatus according to claim 29, wherein the pseudo-random number sequence generation means generates the pseudo-random number sequences in accordance with not only the scramble data but also sector identification data for identifying each sector of the recording medium.

32. A code recording apparatus according to claim 28, wherein the scramble data generation means outputs the respective pseudo-random number sequences in a predetermined order.

33. A code recording apparatus according to claim 29, wherein the scramble data generation means outputs the respective pseudo-random number sequences in a predetermined order.

34. A code recording apparatus according to claim 28, wherein the scramble data generation means selects each of the pseudo-random number sequences based on the random numbers and then outputs the scramble data representing the selected pseudo-random number sequence.

35. A code recording apparatus according to claim 29, wherein the scramble data generation means selects each of the pseudo-random number sequences based on the random numbers and then outputs the scramble data representing the selected pseudo-random number sequence.

36. A code reproducing apparatus for reproducing main data from a recording medium for recording/reproducing the main data thereon/therefrom on a sector basis, scramble data and scrambled main data being recorded in every sector, the scramble data being represented by any of initial values of predetermined pseudo-random number sequences for scrambling the main data, each of the pseudo-random number sequences including a plurality of random numbers beginning with a unique initial value, and the main data having been scrambled by sequentially performing a logical operation on the pseudo-random number sequence representing the scramble data and the main data, the code reproducing apparatus comprising:

read means for reading out the scramble data from a sector of the recording medium;

pseudo-random number sequence generation means for generating a pseudo-random number sequence for descrambling the scrambled main data in accordance with the read out scramble data; and de-scrambling means for restoring original non-scrambled main data by sequentially performing a logical operation on the pseudo-random number sequence and the sector of main data.

*37. A method for scrambling input data, comprising the steps of:*

*generating scramble data having a value which is randomly determined;*

*generating a pseudo-random number sequence in accordance with the value of the scramble data; and*

*generating scrambled data by performing a logical operation on the pseudo-random number sequence and said input data.*

*38. A method according to claim 37, wherein the value of the scramble data is randomly determined on a data unit basis, and each data unit has a predetermined size.*

*39. A method according to claim 37, further comprising the steps of:*

*modulating the scrambled data;*

*obtaining a calculated value of representing a difference between a number of 0 bits and a number of 1 bits included in the modulated scrambled data;*

*determining whether or not a variation of the calculated value has exceeded a predetermined threshold value;*

*newly generating further scramble data having a value which is randomly determined;*

*newly generating a further pseudo-random number sequence in accordance with the value of the newly generated scramble data; and*

*newly generating further scrambled data by performing the logical operation on the newly generated pseudo-random number sequence and the input data.*

*40. A method for recording information onto a recording medium, comprising the steps of:*

*generating scramble data having a value which is randomly determined;*

*generating a pseudo-random number sequence in accordance with the value of the scramble data;*

*generating scrambled data by performing a logical operation on the pseudo-random number sequence and input data; and*

*recording the scramble data and the scrambled data onto the recording medium.*

*41. A method according to claim 40, wherein the value of the scramble data is randomly determined on a data unit basis, and each data unit has a predetermined size.*

*42. A recording medium for recording information thereon,*

*wherein scramble data and scrambled data are recorded onto the recording medium,*

*the scramble data has a value which is randomly determined,*

*and the scrambled data is obtained by generating a pseudo-random number sequence in accordance with the value of the scramble data and by performing a*

*logical operation on the pseudo-random number sequence and input data.*

*43. A recording medium according to claim 41, wherein the value of the scramble data is randomly determined on a data unit basis, and each data unit has a predetermined size.*

* * * * *

UNITED STATES PATENT AND TRADEMARK OFFICE

CERTIFICATE OF CORRECTION

PATENT NO. : RE 39,771 E
APPLICATION NO. : 09/844740
DATED : August 14, 2007
INVENTOR(S) : Yoshiharu Kobayashi et al.

It is certified that error appears in the above-identified patent and that said Letters Patent is hereby corrected as shown below:

Claim 1
Column 33, line 57, “step” should read -- steps --.

Claim 15
Column 36, line 23, immediately after “sequences;”
should be inserted -- modulation means for modulating the scrambled main data unit based on any of plural types of modulation --.

Claim 38
Column 40, line 30, “value of” should read -- value --.

Claim 43
Column 41, line 3, “claim 41” should read -- claim 42 --.

Signed and Sealed this

Twenty-fifth Day of December, 2007

JON W. DUDAS
*Director of the United States Patent and Trademark Office*